US008866169B2

United States Patent
Emerson et al.

(10) Patent No.: US 8,866,169 B2
(45) Date of Patent: Oct. 21, 2014

(54) LED PACKAGE WITH INCREASED FEATURE SIZES

(75) Inventors: David Emerson, Chapel Hill, NC (US); Brian Collins, Raleigh, NC (US); Michael Bergmann, Chapel Hill, NC (US); John Edmond, Durham, NC (US); Eric Tarsa, Goleta, CA (US); Peter Andrews, Durham, NC (US); Bernd Keller, Santa Barbara, CA (US); Christopher Hussell, Cary, NC (US); Amber Salter, Durham, NC (US)

(73) Assignee: Cree, Inc., Goleta, CA (US)

( * ) Notice: Subject to any disclaimer, the term of this patent is extended or adjusted under 35 U.S.C. 154(b) by 109 days.

(21) Appl. No.: 12/757,891

(22) Filed: Apr. 9, 2010

(65) Prior Publication Data

US 2010/0252851 A1    Oct. 7, 2010

Related U.S. Application Data

(63) Continuation-in-part of application No. 11/982,275, filed on Oct. 31, 2007.

(60) Provisional application No. 61/173,550, filed on Apr. 28, 2009.

(51) Int. Cl.
| | |
|---|---|
| *H01L 33/48* | (2010.01) |
| *H01L 33/62* | (2010.01) |
| *H01L 33/64* | (2010.01) |
| *H01L 33/58* | (2010.01) |
| H01L 33/20 | (2010.01) |
| H01L 33/54 | (2010.01) |

(52) U.S. Cl.
CPC ............. *H01L 33/58* (2013.01); *H01L 33/62* (2013.01); *H01L 33/486* (2013.01); *H01L 2924/01087* (2013.01); *H01L 33/641* (2013.01); H01L 33/20 (2013.01); H01L 2224/48091 (2013.01); H01L 2924/01019 (2013.01); H01L 33/54 (2013.01)
USPC  257/98; 257/99; 257/E33.056; 257/E33.057; 257/E33.058

(58) Field of Classification Search
CPC ...... H01L 33/48; H01L 33/483; H01L 33/486
USPC ............. 257/98, 99, E33.056–E33.058
See application file for complete search history.

(56) References Cited

U.S. PATENT DOCUMENTS

| | | | |
|---|---|---|---|
| 3,760,237 A | 9/1973 | Jaffe | 257/98 |
| 4,152,044 A | 5/1979 | Liu | |
| 4,307,297 A | 12/1981 | Groff et al. | |
| 4,322,735 A | 3/1982 | Sadamasa et al. | |
| 4,511,425 A | 4/1985 | Boyd | 156/493 |
| 4,675,575 A | 6/1987 | Smith et al. | |

(Continued)

FOREIGN PATENT DOCUMENTS

| | | |
|---|---|---|
| CN | 1274906 A | 11/2000 |
| CN | 2549313 | 5/2003 |

(Continued)

OTHER PUBLICATIONS

U.S. Appl. No. 11/656,759, Wafer Level Phosphor Coating Method and Devices Fabricated Utilizing Method, filed Jan. 22, 2007.

(Continued)

*Primary Examiner* — Allison P Bernstein
(74) *Attorney, Agent, or Firm* — Koppel, Patrick, Heybl & Philpott

(57) ABSTRACT

A light emitter package having increased feature sizes for improved luminous flux and efficacy. An emitter chip is disposed on a submount with a lens that covers the emitter chip. In some cases, the ratio of the width of the light emitter chip to the width of said lens in a given direction is 0.5 or greater. Increased feature sizes allow the package to emit light more efficiently. Some packages include submounts having square dimensions greater than 3.5 mm used in conjunction with larger emitter chips. Materials having higher thermal conductivities are used to fabricate the submounts, providing the package with better thermal management.

77 Claims, 5 Drawing Sheets

(56) References Cited

U.S. PATENT DOCUMENTS

| | | | |
|---|---|---|---|
| 4,946,547 A | 8/1990 | Palmour et al. ............... 156/643 |
| 5,040,868 A | 8/1991 | Waitl | |
| 5,042,048 A | 8/1991 | Meyer ........................... 372/108 |
| 5,122,943 A | 6/1992 | Pugh ............................ 362/256 |
| 5,130,761 A | 7/1992 | Tanaka ........................... 357/17 |
| 5,167,556 A | 12/1992 | Stein | |
| 5,200,022 A | 4/1993 | Kong et al. ................... 156/612 |
| 5,351,106 A | 9/1994 | Lesko ........................... 355/83 |
| RE34,861 E | 2/1995 | Davis et al. ................... 437/100 |
| 5,477,436 A | 12/1995 | Bertling et al. | |
| 5,703,401 A | 12/1997 | Van de Water | |
| 5,706,177 A | 1/1998 | Nather | |
| 5,790,298 A | 8/1998 | Tonar ............................ 359/267 |
| 5,813,753 A | 9/1998 | Vriens et al. .................. 362/293 |
| 5,907,151 A | 5/1999 | Gramann | |
| 5,942,770 A | 8/1999 | Ishinaga et al. ................ 257/89 |
| 5,959,316 A | 9/1999 | Lowery .......................... 257/98 |
| 6,061,160 A | 5/2000 | Maruyama .................... 359/152 |
| 6,066,861 A | 5/2000 | Hohn et al. | |
| 6,183,100 B1 | 2/2001 | Suckow et al. ................. 362/35 |
| 6,224,216 B1 | 5/2001 | Parker et al. .................... 353/31 |
| 6,259,608 B1 | 7/2001 | Berardinelli et al. | |
| 6,274,924 B1 | 8/2001 | Carey et al. ................... 257/676 |
| 6,296,367 B1 | 10/2001 | Parsons et al. ............... 362/183 |
| 6,330,111 B1 | 12/2001 | Myers | |
| 6,359,236 B1 | 3/2002 | DiStefano et al. | |
| 6,376,902 B1 | 4/2002 | Arndt | |
| 6,447,124 B1 | 9/2002 | Fletcher et al. ............... 359/604 |
| 6,454,437 B1 | 9/2002 | Kelly ............................ 362/246 |
| 6,469,321 B2 | 10/2002 | Arndt | |
| 6,480,389 B1 | 11/2002 | Shie et al. ..................... 361/707 |
| 6,517,218 B2 | 2/2003 | Hochstein ..................... 362/294 |
| 6,536,913 B1 | 3/2003 | Yajima et al. ................. 362/231 |
| 6,573,580 B2 | 6/2003 | Arndt | |
| 6,610,563 B1 | 8/2003 | Waitl | |
| 6,614,058 B2 | 9/2003 | Lin et al. | |
| 6,621,210 B2 | 9/2003 | Kato et al. .................... 313/496 |
| 6,624,491 B2 | 9/2003 | Waitl et al. | |
| 6,657,393 B2 | 12/2003 | Natsume | |
| 6,680,490 B2 | 1/2004 | Yasukawa et al. | |
| 6,686,609 B1 | 2/2004 | Sung | |
| 6,700,136 B2 | 3/2004 | Guida ............................. 257/79 |
| 6,707,069 B2 | 3/2004 | Song et al. ..................... 257/79 |
| 6,710,373 B2 | 3/2004 | Wang | |
| 6,717,353 B1 | 4/2004 | Mueller et al. ............... 313/501 |
| 6,746,889 B1 | 6/2004 | Eliashevich et al. | |
| 6,759,733 B2 | 7/2004 | Arndt ............................ 257/672 |
| 6,765,235 B2 | 7/2004 | Taninaka et al. ............... 257/88 |
| 6,770,498 B2 | 8/2004 | Hsu ................................ 438/26 |
| 6,774,401 B2 | 8/2004 | Nakada et al. | |
| 6,784,463 B2 | 8/2004 | Camras et al. | |
| 6,858,879 B2 | 2/2005 | Waitl | |
| 6,872,585 B2 | 3/2005 | Matsumura et al. | |
| 6,876,149 B2 | 4/2005 | Miyashita | |
| 6,900,511 B2 | 5/2005 | Ruhnau et al. | |
| 6,911,678 B2 | 6/2005 | Fujisawa et al. | |
| 6,919,586 B2 | 7/2005 | Fujii | |
| 6,932,497 B1 | 8/2005 | Huang | |
| 6,940,704 B2 | 9/2005 | Stalions | |
| 6,946,714 B2 | 9/2005 | Waitl | |
| 6,964,877 B2 | 11/2005 | Chen et al. ..................... 438/20 |
| 6,975,011 B2 | 12/2005 | Arndt et al. | |
| 6,995,510 B2 | 2/2006 | Murakami et al. | |
| D517,025 S | 3/2006 | Asakawa ..................... D13/180 |
| 7,021,797 B2 | 4/2006 | Minano et al. ................ 362/355 |
| 7,064,907 B2 | 6/2006 | Kaneko | |
| 7,066,626 B2 | 6/2006 | Omata ........................... 362/257 |
| 7,087,936 B2 | 8/2006 | Negley | |
| 7,102,213 B2 | 9/2006 | Sorg | |
| 7,119,422 B2 | 10/2006 | Chin ............................. 257/666 |
| 7,161,189 B2 | 1/2007 | Wu ................................ 257/98 |
| 7,187,009 B2 | 3/2007 | Fukasawa et al. .............. 257/98 |
| 7,224,000 B2 | 5/2007 | Aanegola et al. ............... 257/98 |
| 7,244,965 B2 | 7/2007 | Andrews et al. ............... 257/98 |
| 7,282,740 B2 | 10/2007 | Chikugawa et al. ............ 257/79 |
| 7,285,802 B2 | 10/2007 | Ouderkirk et al. ............. 257/98 |
| 7,303,315 B2 | 12/2007 | Ouderkirk et al. ........... 362/294 |
| D572,210 S | 7/2008 | Lee ............................. D13/180 |
| D572,670 S | 7/2008 | Ono et al. .................... D13/180 |
| D576,574 S | 9/2008 | Kobayakawa ............... D13/180 |
| 7,429,757 B2 | 9/2008 | Oyama et al. ................. 257/675 |
| 7,579,628 B2 | 8/2009 | Inoguchi ........................ 257/81 |
| 7,622,795 B2 | 11/2009 | Chiang ......................... 257/675 |
| 7,692,206 B2 | 4/2010 | Loh ................................ 257/99 |
| 7,875,899 B2 | 1/2011 | Yasuda .......................... 257/99 |
| 7,923,831 B2 | 4/2011 | Ng ............................... 257/692 |
| 8,217,414 B2 | 7/2012 | Hayashi ........................ 257/99 |
| 2002/0015013 A1 | 2/2002 | Ragle | |
| 2002/0054495 A1 | 5/2002 | Natsume | |
| 2002/0061174 A1 | 5/2002 | Hurt et al. | |
| 2002/0123163 A1 | 9/2002 | Fujii | |
| 2002/0163001 A1 | 11/2002 | Shaddock | |
| 2002/0195935 A1 | 12/2002 | Jager et al. | |
| 2003/0015708 A1 | 1/2003 | Parikh et al. | |
| 2003/0116769 A1 | 6/2003 | Song et al. | |
| 2003/0160256 A1 | 8/2003 | Durocher et al. .............. 257/88 |
| 2003/0183852 A1 | 10/2003 | Takenaka | |
| 2004/0016938 A1 | 1/2004 | Baretz et al. .................. 257/100 |
| 2004/0037076 A1 | 2/2004 | Katoh et al. .................. 362/235 |
| 2004/0041222 A1 | 3/2004 | Loh et al. | |
| 2004/0047151 A1 | 3/2004 | Bogner et al. | |
| 2004/0061120 A1 | 4/2004 | Mizuyoshi | |
| 2004/0079957 A1* | 4/2004 | Andrews et al. .............. 257/100 |
| 2004/0080251 A1 | 4/2004 | Steranka | |
| 2004/0080939 A1 | 4/2004 | Braddell et al. | |
| 2004/0090174 A1 | 5/2004 | Tasch et al. | |
| 2004/0126913 A1 | 7/2004 | Loh | |
| 2004/0227149 A1 | 11/2004 | Ibbetson | |
| 2004/0232435 A1 | 11/2004 | Hofer | |
| 2004/0238930 A1 | 12/2004 | Arndt | |
| 2005/0023548 A1 | 2/2005 | Bhat | |
| 2005/0072981 A1 | 4/2005 | Suenaga | |
| 2005/0077535 A1 | 4/2005 | Li | |
| 2005/0082574 A1 | 4/2005 | Tasch et al. | |
| 2005/0093005 A1 | 5/2005 | Ruhnau | |
| 2005/0110033 A1 | 5/2005 | Heremans et al. .............. 257/98 |
| 2005/0117320 A1 | 6/2005 | Leu et al. | |
| 2005/0127377 A1 | 6/2005 | Arndt | |
| 2005/0152127 A1 | 7/2005 | Kamiya et al. | |
| 2005/0173692 A1 | 8/2005 | Park et al. | |
| 2005/0179376 A1 | 8/2005 | Fung et al. | |
| 2005/0199899 A1* | 9/2005 | Lin et al. ........................ 257/99 |
| 2005/0231983 A1 | 10/2005 | Dahm | |
| 2005/0253130 A1 | 11/2005 | Tsutsumi et al. ............... 257/13 |
| 2006/0006404 A1 | 1/2006 | Ibbetson | |
| 2006/0022212 A1 | 2/2006 | Waitl | |
| 2006/0049477 A1 | 3/2006 | Arndt et al. | |
| 2006/0054912 A1 | 3/2006 | Murakami et al. | |
| 2006/0060867 A1* | 3/2006 | Suehiro ......................... 257/81 |
| 2006/0081862 A1 | 4/2006 | Chua et al. | |
| 2006/0091406 A1 | 5/2006 | Kaneko et al. ................. 257/81 |
| 2006/0102917 A1 | 5/2006 | Oyama et al. | |
| 2006/0105478 A1* | 5/2006 | Camras et al. ................. 438/22 |
| 2006/0108594 A1 | 5/2006 | Iwasaki et al. | |
| 2006/0131591 A1 | 6/2006 | Sumitani | |
| 2006/0133044 A1 | 6/2006 | Kim et al. | |
| 2006/0151809 A1 | 7/2006 | Isokawa | |
| 2006/0157828 A1 | 7/2006 | Sorg | |
| 2006/0158899 A1 | 7/2006 | Ayabe et al. | |
| 2006/0220046 A1 | 10/2006 | Yu et al. | |
| 2006/0267031 A1 | 11/2006 | Tasch et al. | |
| 2006/0267042 A1 | 11/2006 | Izuno et al. ................... 257/100 |
| 2006/0278882 A1 | 12/2006 | Leung et al. ................... 257/98 |
| 2006/0291185 A1 | 12/2006 | Atsushi .......................... 362/29 |
| 2007/0046176 A1 | 3/2007 | Bukesov et al. | |
| 2007/0096139 A1 | 5/2007 | Schultz | |
| 2007/0109779 A1 | 5/2007 | Sekiguchi et al. | |
| 2007/0145401 A1 | 6/2007 | Ikehara | |
| 2007/0170449 A1 | 7/2007 | Anandan | |
| 2007/0170450 A1 | 7/2007 | Murphy | |
| 2007/0241357 A1 | 10/2007 | Yan ............................... 257/98 |
| 2007/0262328 A1 | 11/2007 | Bando | |
| 2007/0269586 A1 | 11/2007 | Leatherdale et al. | |
| 2007/0295975 A1 | 12/2007 | Omae ............................ 257/89 |

(56) References Cited

U.S. PATENT DOCUMENTS

| | | | |
|---|---|---|---|
| 2008/0013319 A1 | 1/2008 | Pei et al. | |
| 2008/0026498 A1 | 1/2008 | Tarsa et al. | 438/26 |
| 2008/0074032 A1 | 3/2008 | Yano et al. | 313/503 |
| 2008/0079017 A1 | 4/2008 | Loh | |
| 2008/0093606 A1 | 4/2008 | Pan et al. | |
| 2008/0121921 A1 | 5/2008 | Loh et al. | |
| 2008/0149960 A1 | 6/2008 | Amo et al. | 257/98 |
| 2008/0170391 A1 | 7/2008 | Norfidathul et al. | 362/227 |
| 2008/0186702 A1 | 8/2008 | Camras et al. | |
| 2008/0191232 A1 | 8/2008 | Lee et al. | |
| 2008/0198594 A1 | 8/2008 | Lee | |
| 2008/0230790 A1 | 9/2008 | Seko et al. | |
| 2008/0258156 A1 | 10/2008 | Hata | 257/88 |
| 2008/0258168 A1 | 10/2008 | Loh | |
| 2008/0296590 A1 | 12/2008 | Ng | 257/88 |
| 2008/0303052 A1 | 12/2008 | Lee et al. | |
| 2009/0050907 A1 | 2/2009 | Yuan | |
| 2009/0050908 A1 | 2/2009 | Yuan et al. | |
| 2009/0050924 A1 | 2/2009 | Edmond | |
| 2009/0057708 A1 | 3/2009 | Abdul Karim et al. | 257/100 |
| 2009/0072251 A1 | 3/2009 | Chan et al. | 257/89 |
| 2009/0095966 A1* | 4/2009 | Keller et al. | 257/98 |
| 2009/0108281 A1 | 4/2009 | Keller et al. | |
| 2009/0129085 A1 | 5/2009 | Aizar et al. | 362/247 |
| 2009/0189178 A1 | 7/2009 | Kim et al. | |
| 2009/0283781 A1 | 11/2009 | Chan et al. | |
| 2010/0044735 A1 | 2/2010 | Oyamada | |
| 2010/0103660 A1 | 4/2010 | Van De Ven et al. | 362/231 |
| 2010/0193822 A1 | 8/2010 | Inobe et al. | 257/98 |
| 2011/0049545 A1 | 3/2011 | Basin et al. | 257/98 |
| 2011/0108874 A1 | 5/2011 | Chu et al. | |
| 2011/0121345 A1 | 5/2011 | Andrews et al. | |
| 2011/0186880 A1 | 8/2011 | Kohler et al. | 257/91 |
| 2011/0193118 A1 | 8/2011 | Oshima et al. | |
| 2011/0278617 A1 | 11/2011 | Lee | |
| 2012/0235199 A1 | 9/2012 | Andrews et al. | |
| 2012/0257386 A1 | 10/2012 | Harbers et al. | 362/235 |

FOREIGN PATENT DOCUMENTS

| | | |
|---|---|---|
| CN | 1581527 A | 2/2005 |
| CN | 1591924 A | 3/2005 |
| CN | 1679168 A | 10/2005 |
| CN | 1720608AA | 1/2006 |
| CN | 1744335 A | 3/2006 |
| CN | 1874011 A | 12/2006 |
| CN | 1913135 A | 2/2007 |
| CN | 101005109 A | 7/2007 |
| CN | 101013689 | 8/2007 |
| DE | WO 9931737 | 6/1999 |
| DE | WO 2004027882 | 4/2004 |
| DE | 202007012162 | 4/2008 |
| EP | 0936682 A | 8/1999 |
| EP | 1005085 A2 | 5/2000 |
| EP | 1187226 A1 | 3/2002 |
| EP | 1187227 | 3/2002 |
| EP | 11875228 | 3/2002 |
| EP | 1349202 A | 10/2003 |
| EP | 1521313 | 4/2005 |
| EP | 1 536 487 A1 | 6/2005 |
| EP | 1653254 A2 | 3/2006 |
| EP | 1653255 | 5/2006 |
| EP | 1681509 | 7/2006 |
| EP | 1864780 | 12/2007 |
| FR | 2586844 | 3/1987 |
| FR | 2759188 | 8/1998 |
| GB | 2466633 A | 7/2010 |
| JP | S53118019 | 10/1978 |
| JP | S53126570 | 10/1978 |
| JP | 59027559 | 2/1984 |
| JP | 6148951 | 3/1986 |
| JP | S62160564 | 3/1986 |
| JP | 61048951 | 10/1986 |
| JP | 62047156 | 2/1987 |
| JP | 62140758 | 5/1987 |
| JP | 62140758 | 9/1987 |
| JP | 038459 | 1/1991 |
| JP | 07202271 | 8/1995 |
| JP | 08032120 | 2/1996 |
| JP | 61048951 | 3/1996 |
| JP | 8139257 | 5/1996 |
| JP | 10135492 | 5/1998 |
| JP | 10321909 | 12/1998 |
| JP | 2000223752 | 8/2000 |
| JP | 2000261041 | 9/2000 |
| JP | 200160072 | 3/2001 |
| JP | 2001237463 | 8/2001 |
| JP | 2002009217 | 1/2002 |
| JP | 52002374005 | 12/2002 |
| JP | 2003318449 | 11/2003 |
| JP | 2003324214 | 11/2003 |
| JP | 2004022862 | 1/2004 |
| JP | 2004056075 | 2/2004 |
| JP | 2004103775 | 2/2004 |
| JP | 2004507114 | 3/2004 |
| JP | 2004146815 | 5/2004 |
| JP | 2004228387 | 8/2004 |
| JP | 2004327955 | 11/2004 |
| JP | 2004335740 | 11/2004 |
| JP | 2004335880 | 11/2004 |
| JP | 2004342870 | 12/2004 |
| JP | 2005019838 | 1/2005 |
| JP | 2005223222 | 8/2005 |
| JP | 2005259754 | 9/2005 |
| JP | 2005259972 | 9/2005 |
| JP | 2005347401 | 12/2005 |
| JP | 2005539386 | 12/2005 |
| JP | 2006019557 | 1/2006 |
| JP | 2006508537 | 3/2006 |
| JP | 2006509372 A | 3/2006 |
| JP | 2006108517 | 4/2006 |
| JP | 2006179520 | 7/2006 |
| JP | 2006253689 | 9/2006 |
| JP | 2006332234 | 12/2006 |
| JP | 2006344692 | 12/2006 |
| JP | 2007509505 | 4/2007 |
| JP | 2007165840 | 6/2007 |
| JP | 2007184542 | 7/2007 |
| JP | 2007243226 | 9/2007 |
| JP | 2007273763 | 10/2007 |
| JP | 2007317896 | 12/2007 |
| JP | 2007329516 | 12/2007 |
| JP | 2008518461 | 5/2008 |
| JP | 2008521236 | 6/2008 |
| RU | 2251761 | 2/2005 |
| WO | WO 9856043 | 12/1998 |
| WO | WO 0211212 A | 2/2002 |
| WO | WO 0217405 | 2/2002 |
| WO | 03044870 | 5/2003 |
| WO | WO 03049204 | 6/2003 |
| WO | WO 200403660 | 4/2004 |
| WO | WO 2004036660 | 4/2004 |
| WO | WO 2004044877 | 5/2004 |
| WO | WO 2005104247 | 11/2005 |
| WO | WO 2006016398 | 2/2006 |
| WO | WO 2006046981 | 5/2006 |
| WO | WO 2006054228 | 5/2006 |
| WO | WO 2006054228 A2 | 5/2006 |
| WO | WO 2006054228 A3 | 5/2006 |
| WO | WO 2006054228 | 6/2006 |
| WO | WO 2006135502 | 12/2006 |
| WO | WO 2007005844 A | 1/2007 |
| WO | WO 2007121486 A2 | 10/2007 |
| WO | WO 2007122516 | 11/2007 |
| WO | WO 2008081794 A1 | 7/2008 |
| WO | WO 2008082098 | 7/2008 |
| WO | WO 20088820998 | 7/2008 |
| WO | WO 2010005294 | 1/2010 |
| WO | WO 2012099145 A1 | 7/2012 |

OTHER PUBLICATIONS

U.S. Appl. No. 11/899,790, Wafer Level Phosphor Coating Method and Devices Fabricated Utilizing Method, filed Sep. 7, 2007.

(56) References Cited

OTHER PUBLICATIONS

U.S. Appl. No. 11/473,089, "Close Loop Electrophoretic Deposition of Semiconductor Devices", filed Jun. 21, 2006.
U.S. Appl. No. 11/982,275, dated: Oct. 31, 2007, to Keller.
U.S. Appl. No. 12/024,400, dated: Feb. 1, 2008, to Chakraborty.
JP 2001 060072A, Abstract, Matsushita Electric Ind. Co Ltd., Mar. 6, 222001.
Preliminary Notice of Reasons for Refusal from Japanese Application No. 2009-002857, dated: Apr. 24, 2009, pp. 1-2.
Nichia Corp. White LED Part No. NSPW300BS, Specification for Nichia White LED, Model NSPW300BS., Jan. 14, 2004.
Nicha Corp., White LED Part No. NSPW312BS, Specification for Nichia White LED, Model NSPW312BS. Jan. 14, 2004.
Kim J.K et al. "Strongly Enhanced Phosphor Efficiency in GaInN White Light-Emitting Diodes Using Remote Phosphor Configuration and Diffuse Reflector Cup" Japanese Journal of Applied Physics, Japan Society of Applied Physics, Tokyo, JP, vol. 44, No. 20-23, Jan. 1, 2005 XP-001236966, pp. 649-651.
Preliminary Notice of Reasons for Refusal Japanese Application No. 2009-002857, dated: Jul. 24, 2009, pp. 1-6.
Office Action from Chinese Application No. 200710142310.7 dated Dec. 11, 2009.
International Search Report for PCT/CN2009/074800 mailed Feb. 25, 2010.
International Search Report and Written Opinion in counterpart Application No. PCT/US2010/001255 mailed Aug. 13, 2010.
Interrogation from Japanese Patent Application No. 2007-211901. dated Aug. 21, 2012.
Examination Report from European Patent Application No. 07789665.2, dated Aug. 20, 2012.
Decision of Rejection from Chinese Patent Application No. 200880009255.7, dated Sep. 5. 2012.
Office Action from Chinese Patent Application No. 200710142310.7, dated Dec. 11, 2009.
Office Action from Patent Application No. 11/600,617, dated Dec. 22, 2009.
Official Communication from the EPO regarding related European Application No. 08253301.9, dated Nov. 17, 2009.
Second Office Action from related Chinese Application No. 200710142217.6, dated Nov. 6, 2009.
European Search Report from related European Application No. 07254498.4, received on Feb. 11, 2010.
Office Action in related U.S. Appl. No. 11/496,922, dated: Jun. 10, 2010.
Office Action in related U.S. Appl. No. 11/496,922, dated: Dec. 15, 2010.
Office Action in related U.S. Appl. No. 12/152,766, dated: Oct. 7, 2010.
Office Action in related U.S. Appl. No. 12/152,766, dated: Apr. 1, 2011.
Office Action in related U.S. Appl. No. 12/152,766, dated: Mar. 12, 2010.
Office Action in related U.S. Appl. No. 11/465,120, dated: Sep. 8, 2010.
Office Action in related U.S. Appl. No. 11/465,120, dated: Dec. 13, 2010.
Office Action in related U.S. Appl. No. 11/465,120, dated: Mar. 9, 2010.
Office Action in related U.S. Appl. No. 12/635,818, dated: Oct. 14, 2010.
Office Action in related U.S. Appl. No. 12/695,978, dated: Dec. 20, 2010.
Office Action in related U.S. Appl. No. 12/695,978, dated: May 10, 2011.
Office Action in related U.S. Appl. No. 12/069,827, dated: Oct. 29, 2010.
Office Action in related U.S. Appl. No. 12/069,827, dated: Apr. 20, 2010.
Office Action in related U.S. Appl. No. 12/069,827, dated: Jan. 27, 2011.

U.S. Appl. No. 11/613,692, filed Dec. 20, 2006.
U.S. Appl. No. 11/614,180, filed Dec. 21, 2006.
U.S. Appl. No. 11/624,811, filed Jan. 19, 2007.
U.S. Appl. No. 11/743,754, filed May 3, 2007.
U.S. Appl. No. 11/751,982, filed May 22, 2007.
U.S. Appl. No. 11/753,103, filed May 24, 2007.
U.S. Appl. No. 11/751,990, filed May 22, 2007.
U.S. Appl. No. 11/755,153, filed May 30, 2007.
U.S. Appl. No. 11/856,421, filed Sep. 17, 2007.
U.S. Appl. No. 11/859,048, filed Sep. 21, 2007.
U.S. Appl. No. 11/939,047, filed Nov. 13, 2007.
U.S. Appl. No. 11/936,163, filed Nov. 7, 2007.
U.S. Appl. No. 11/843,243, filed Aug. 22, 2007.
U.S. Appl. No. 11/939,052, filed Nov. 13, 2007.
U.S. Appl. No. 11/736,799, filed Apr. 18, 2007.
U.S. Appl. No. 11/877,038, filed Oct. 23, 2007.
U.S. Appl. No. 11/870,679, filed Oct. 11, 2007.
U.S. Appl. No. 11/948,041, filed Nov. 30, 2007.
U.S. Appl. No. 11/949,222, filed Dec. 3, 2007.
U.S. Appl. No. 12/174,053, filed Jul. 16, 2008.
U.S. Appl. No. 12/002,429, filed Dec. 4, 2007.
U.S. Appl. No. 12/045,729, filed Mar. 11, 2008.
U.S. Appl. No. 11/818,818, filed Jun. 14, 2007.
U.S. Appl. No. 11/443,741, filed Jun. 14, 2007.
U.S. Appl. No. 11/685.761, filed Mar. 13, 2007.
U.S. Appl. No. 11/939,059, filed Nov. 13, 2007.
Cree® Xlamp MC-E LEDs Product Data Sheet, 14 pages.
Nichia Corporation LEDs, Specification for NSSM227AT, 15 pages.
Nichia Corporation LEDs, Specification for NESM026CT, 15 pages.
Nichia Corporation LEDs, Specification for NSSM026BBT, 15 pages.
Third Office Action from Chinese Patent Application No. 200710152109.7. dated: Mar. 5, 2013.
Interrogation from Japanese Patent Application No. 2008-515695, dated Feb. 19, 2013.
First Office Action from Chinese Patent Application No. 201080001658.4, dated Sep. 24, 2012.
Extended Search Report for European Patent Application No. 09824413.0-1551. dated Feb. 11, 2013 (P0857EP-7).
Second Office Action from Chinese Patent Appl. No. 201110039138.9. dated Jan. 31, 2013.
Extended Search Report for European Patent Appl. No. 09824413.0-1551, dated Feb. 11, 2013.
Second Office Action from Chinese Patent Appl. No. 201110039138.9, dated Jan. 31, 2013.
International Search Report and Written Opinion from PCT Application No. PCT/US2012/065060, dated Feb. 20, 2013.
Communication from European Patent Appl. No. 09824413.0-1551, dated Feb. 28, 2013.
European Search Report from European Patent Appl. No 09824413.0-1551, dated Fob. 11, 2013.
Notice of Reasons for Rejection from Japanese Patent Appl. No 2011-534993, dated Mar. 12, 2013.
Notification of the Second Office Action from Chinese Patent Application No. 201010167346.2, dated Feb. 17, 2013.
Office Action from Japanese Patent Appl. No. 2012-288000, dated Oct. 8, 2013.
Decision of Rejection from Chinese Patent Appl. No. 201110039138.9 dated Sep. 25, 2013.
Office Action from U.S. Appl. No. 12/695,978, dated Sep. 17, 2013.
Office Action from U.S. Appl. No. 13/652.241, dated Sep. 11, 2013.
Office Action from U.S. Appl. No. 12/002,410, dated Sep. 10, 2013.
Decision of Rejection from Chinese Patent Appl. No. 201080001658.4, dated Jun. 20, 2013.
Office Action from U.S. Appl. No. 12/868,567, dated Jul. 5, 2013.
Office Action from U.S. Appl. No. 12/875,873, dated Jul. 3, 2013.
Office Action from U.S. Appl. No. 11/496,922, dated Jun. 26, 2013.
Office Action from U.S. Appl. No. 11/982,275, dated May 9, 2013.
Office Action from U.S. Appl. No. 12/069,827, dated Mar. 5, 2013.
Response to OA from U.S. Appl. No. 12/069,827, filed Jun. 5, 2013.
Office Action from U.S. Appl. No. 11/149,998, filed Apr. 3, 2013.
Response to OA from U.S. Appl. No. 11/149,998, filed Jun. 25, 2013.
Office Action from U.S. Appl. No. 12/868,567, dated Sep. 12, 2012.

(56) References Cited

OTHER PUBLICATIONS

Response to OA from U.S. Appl. No. 12/868,567, filed Jan. 14, 2013.
Office Action from U.S. Appl. No. 11/982,275, dated Sep. 18, 2012.
Response to OA from U.S. Appl. No. 11/982,275, filed Sep. 27, 2012.
Office Action from U.S. Appl. No. 12/002,410, dated Sep. 25, 2012.
Response to OA from U.S. Appl. No. 12/002,410, filed Dec. 18, 2012.
Office Action from U.S. Appl. No. 12/069,827, dated Aug. 9, 2012.
Response to OA from U.S. Appl. No. 12/069,827, filed Nov. 9, 2012.
Office Action from U.S. Appl. No. 11/465,120, dated Aug. 21, 2012.
Response to OA from U.S. Appl. No. 11/465,120, filed Aug. 24, 2012.
Office Action from U.S. Appl. No. 12/875,873, dated Aug. 22, 2012.
Response to OA from U.S. Appl. No. 12/875,873, filed Nov. 19, 2012.
Office Action from U.S. Appl. No. 11/465,120, dated Jun. 19, 2012.
Response to OA from U.S. Appl. No. 11/465,120, filed Aug. 15, 2012.
Office Action from U.S. Appl. No. 11/982,275, dated Jul. 9, 2012.
Response to OA from U.S. Appl. No. 11/982,275, filed Sep. 18, 2012.
Office Action from U.S. Appl. No. 12/757,179, dated Jul. 16, 2012.
Response to OA from U.S. Appl. No. 12/757,179, filed Sep. 25, 2012.
Office Action from U.S. Appl. No. 12/069,827, dated Dec. 6, 2012.
Response to OA from U.S. Appl. No. 12/069,827, filed Jan. 29, 2013.
Office Action from U.S. Appl. No. 11/982,275, dated Nov. 28, 2012.
Response to OA from U.S. Appl. No. 11/982,275, filed Mar. 21, 2013.
Office Action from U.S. Appl. No. 11/496,922, dated Nov. 23, 2012.
Response to OA from U.S. Appl. No. 11/496,922, filed Apr. 23, 2013.
Office Action from U.S. Appl. No. 13/306,589, dated Feb. 20, 2013.
Response to OA from U.S. Appl. No. 13/306,589, filed May 16, 2013.
Office Action from U.S. Appl. No. 12/002,410, dated Jan. 29, 2013.
Response to OA from U.S. Appl. No. 12/002,410, filed Apr. 18, 2013.
Office Action from U.S. Appl. No. 12/868,567, dated Feb. 22, 2013.
Response to OA from U.S. Appl. No. 12/868,567, filed May 21, 2013.
Office Action from U.S. Appl. No. 12/875,873, dated Feb. 21, 2013.
Response to OA from U.S. Appl. No. 12/875,873, filed Apr. 19, 2013.
Office Action from U.S. Appl. No. 12/291,293, dated Feb. 28, 2013.
Response to OA from U.S. Appl. No. 12/291,293, filed Jun. 5, 2013.
Office Action from U.S. Appl. No. 12/645,978, dated Apr. 18, 2013.
Response to OA from U.S. Appl. No. 12/695,978, filed Jul. 10, 2013.
Decision of Rejection from Japanese Patent Application No. 2009-507195, dated May 21, 2013.
Notice of Reasons for Rejection from Japanese Patent Appl. No. 2011-259253, dated May 28, 2013.
Decision of Rejection from Japanese Patent Appl. No. 2008-281533, dated May 28, 2013.
Notice of Reasons for Rejection from Japanese Patent Appl. No. 2007-211901, dated Oct. 8, 2013.
Notification of Loss of Rights from European Patent Appl. No. 09824413.0, dated Oct. 17, 2013.
Appeal board's Questioning from Japanese Patent Appl. No. 2011-545616, dated Nov. 12, 2013.
Office Action from U.S. Appl. No. 12/069,827, dated Oct. 25, 2013.
Office Action from U.S. Appl. No. 11/496,922, dated Oct. 9, 2013.
Office Action from U.S. Appl. No. 12/875,873, dated Oct. 18, 2013.
Appeal Decision from Japanese Patent Appl. No 2008-515699, dated Sep. 20, 2013.
Decision of Rejection from Chinese Patent Appl No. 201001067346.2, dated Aug. 30, 2013.
Fourth Office Action from Chinese Patent Appl. No. 200710152109.7, dated Jun. 28, 2013.
Office Action from U.S. Appl. No. 11/149,998, dated Jul. 26, 2013.
Office Action from U.S. Appl. No. 11/982,275, dated Aug. 8, 2013.
Office Action from U.S. Appl. No. 12/069,827, dated Jul. 3, 2013.
Office Action from U.S. Appl. No. 12/291,293, dated Aug. 20, 2013.
Notice of Reasons for Rejection from Japanese Patent Application No 2007-211901, dated Apr. 9, 2013.
Decision of Rejection from Japanese Patent Application No,. 2011-545616, dated Apr. 26, 2013.
Fifth Office Action from Chinese Patent Appl. No. 2007/10152109.7, dated Jan. 6, 2014.
Supplemental European Search Report from European Patent Appl. No. 10731037.7, dated Jan. 9, 2014.
First Office Action from Chinese Patent Appl. No. 201080027586.0, dated Feb. 8, 2014.
Interrogation from Japanese Patent Appl. No. 2009-507195, dated Jan, 28. 2014.
Notification of Designation of the Appeal Examiner from Japanese Patent Appl. No. 2009-507195, dated Jan. 22, 2014.
Interrogation from Japanese Patent Appl. No. 2008-281533, dated Jan. 21, 2014.
International Search Report and Written Opinion from PCT/US2013/073921, dated Feb. 18, 2014.
Decision of Registration from Japanese Design Appl. No. 2012-030304, dated Jan. 21, 2014.
Office Action from U.S. Appl. No. 12/695,978, dated Jan. 31, 2014.
Office Action from U.S. Appl. No. 12/002,410, dated Feb. 4, 2014.
Search Report for European Patent Appl. No. 10731037.7, dated Dec. 11, 2013.
Notice of Reasons for Rejection from Japanese Patent Appl. No. 2011-534993, dated Nov. 12, 2013.
Office Action from Russian Patent Appl. No. 2011146934/28, dated Feb. 28. 2014.
Second Office Action from Chinese Patent Appl. No. 201210046248.2, dated Apr. 15, 2014.
Partial European Search Report from European Patent Appl. No. 08253519.6-1564 dated Apr. 29, 2014.
Decision of Rejection from Japanese Patent Appl. No. 2011-259253, dated Mar. 25, 2014.
Office Action from U.S. Appl. No. 12/875,873, dated Feb. 25, 2014.
Office Action from U.S. Appl. No. 13/652,241, dated Mar. 12, 2014.
Office Action from U.S. Appl. No. 12/069,827, dated Apr. 1, 2014.
Notice Requesting Submission of Opinion regarding related Korean application No. 10-2004-7001033, dated Mar. 9, 2009.
Sakai, et al. "Experimental Investigation of Dependence of Electrical Characteristics on Device Parameters in Trench MOS Barrier Schottky Diodes". Proceedings of 1998 International Symposium on Power Semiconductor Devices & ICs, Kyoto, pp. 293-296. Jun. 1998.
Zhang AP. et al. "Comparison of GAN P-I-N. And Schottky Rectifier Performance". IEEE Transactions on Electron Devices. IEEE Inc. New York, US, vol. 48. No. 3. pp. 407-411. Mar. 2001.
US Publication No. 2007/090383 A1. Ota. et al. Apr. 26, 2007.
US Publication No. 2004/0207313 A1. Omoto. et al. Oct. 21, 2004.
US Publication No. 2008/0036364 A1. Li. et al. Feb. 14, 2008.
Decision of Re-Examination from Chinese Patent Appl. No. 201110039138 9. dated Mar. 13, 2014.
Notification of Reexamination from Chinese Patent Appl. No. 2008800092557, dated May 12, 2014.
Examination from European Patent Appl. No. 09 824 413.0-1551. dated May 16, 2014.
Decision on Rejection from Chinese Patent Appl. No 2007101521097, dated Mar. 17, 2014.
Search Report from Chinese Patent Appl. No. 201210046248 2, dated Apr. 15, 2014.
International Preliminary Report on Patentability from PCT/US2012/065060, dated Jun. 12, 2014.
Office Action from U.S. Appl. No. 11/982,275, dated Apr. 30, 2014.
Office Action from U.S. Appl. No. 12/002,410, dated May 20, 2014.
Decision on Appeal from Japanese Patent Appl. No. 2011-545616, dated Jun. 27, 2014.
Reason for Rejection from Japanese Patent Appl. No. 2009-507195, dated Jul. 15, 2014.
Notification of Allowance from Taiwan Appl. Patent No. 103202911, dated Jul. 16, 2014.
Office Action from Japanese Patent Appl. No. 2008-81533, dated Jul. 22. 2014.
Third Office Action and Search Report from Chinese Patent Appl. No. 2011100391389, dated Jun. 23. 2014.

* cited by examiner

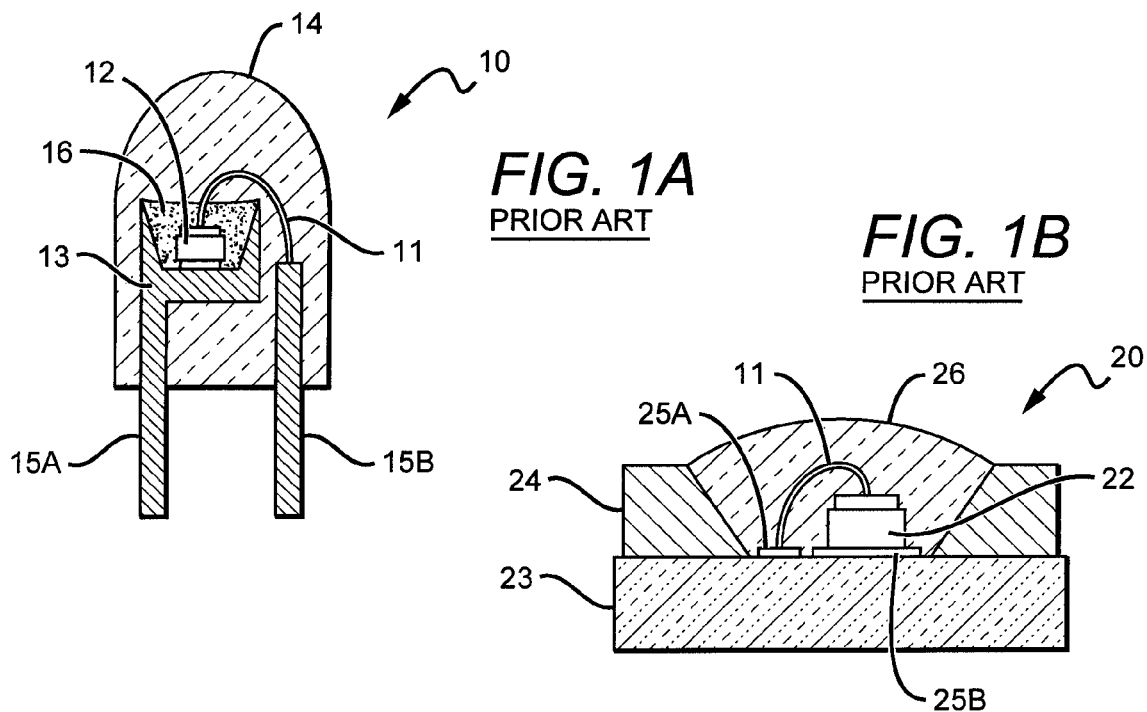
FIG. 1A PRIOR ART
FIG. 1B PRIOR ART
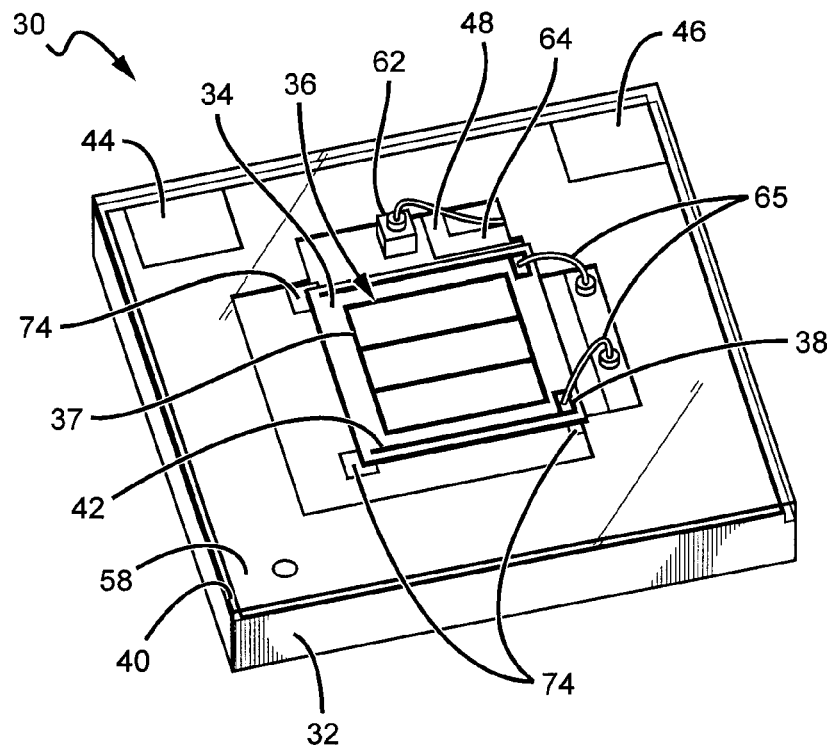
FIG. 2

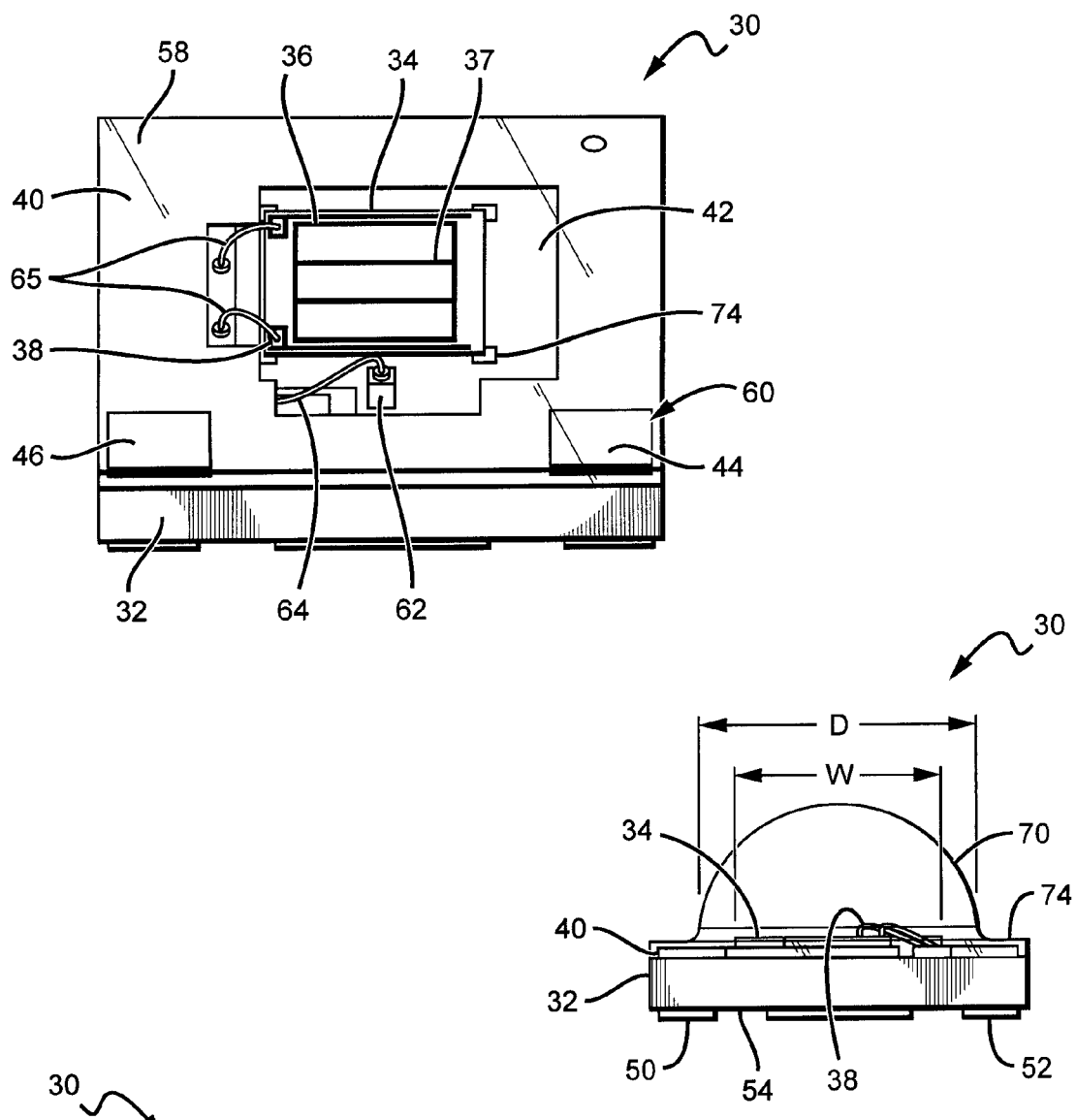
FIG. 3
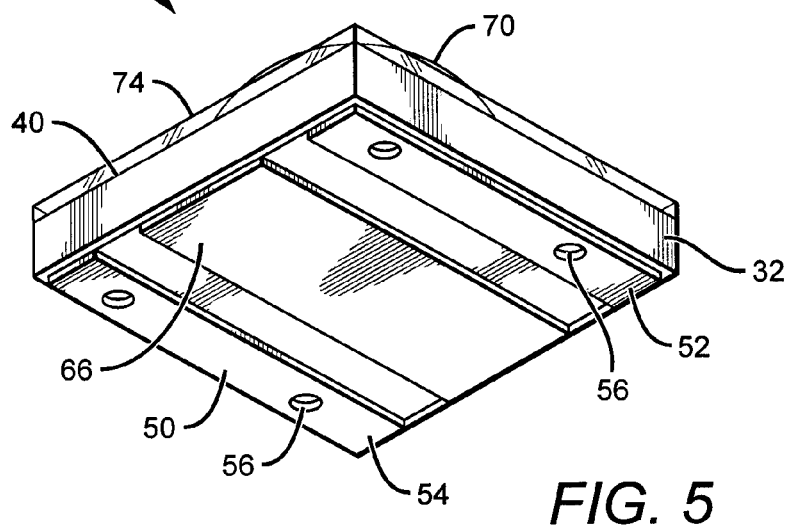
FIG. 4
FIG. 5

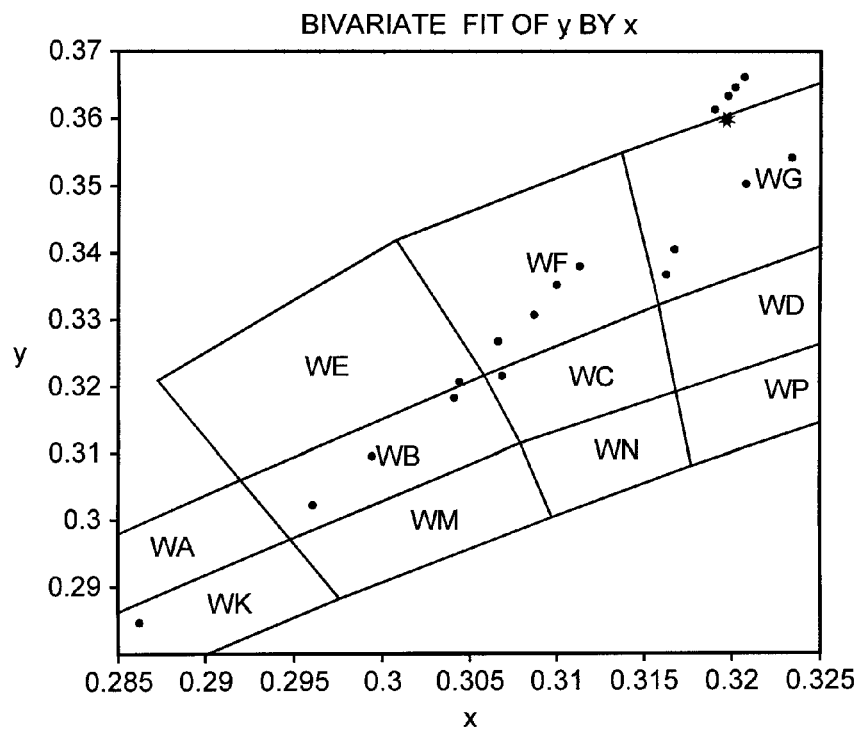
FIG. 10
FIG. 11
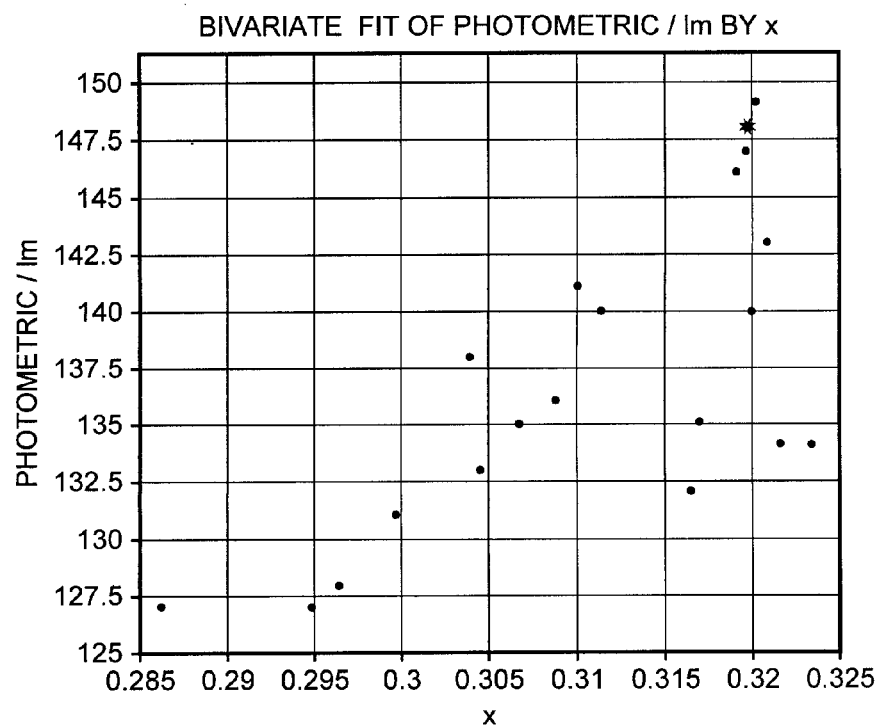

LED PACKAGE WITH INCREASED FEATURE SIZES

This application is a continuation-in-part of prior U.S. patent application Ser. No. 11/982,275, filed 31 Oct. 2007. This application claims the benefit of U.S. Provisional Application No. 61/173,550, filed 28 Apr. 2009.

BACKGROUND OF THE INVENTION

1. Field of the Invention

This invention relates to light emitter packages, and in particular to light emitting diode (LED) packages having a molded lens.

2. Description of the Related Art

Light emitting diodes (LED or LEDs) are solid state devices that convert electric energy to light, and generally comprise one or more active layers of semiconductor material sandwiched between oppositely doped layers. When a bias is applied across the doped layers, holes and electrons are injected into the active layer where they recombine to generate light. Light is emitted from the active layer and from all surfaces of the LED.

In order to use an LED chip in a circuit or other like arrangements, it is known to enclose an LED chip in a package to provide environmental and/or mechanical protection, color selection, light focusing and the like. An LED package can also include electrical leads, contacts or traces for electrically connecting the LED package to an external circuit. FIG. 1A shows a conventional LED package that generally comprises a single LED chip 12 mounted on a reflective cup 13 by means of a solder bond or conductive epoxy. One or more wire bonds 11 connect the ohmic contacts of the LED chip 12 to leads 15A and/or 15B, which may be attached to or integral with the reflective cup 13. The reflective cup 13 can be filled with an encapsulant material 16 which can contain a wavelength conversion material such as a phosphor. Light emitted by the LED at a first wavelength can be absorbed by the phosphor, which can responsively emit light at a second wavelength. The entire assembly is then encapsulated in a clear protective resin 14, which may be molded in the shape of a lens over the LED chip 12.

FIG. 1B shows another conventional LED package 20 that may be more suited for high power operations that can generate more heat. In the LED package 20, one or more LED chips 22 are mounted onto a carrier such as a printed circuit board (PCB) carrier, substrate or submount 23. A reflector 24 can be included on the submount 23 that surrounds the LED chip(s) 22 and reflects light emitted by the LED chips 22 away from the package 20. Different reflectors can be used such as metal reflectors, omni-directional reflectors (ODRs), and distributed Bragg reflectors (DBRs). The reflector 24 can also provide mechanical protection to the LED chips 22. One or more wirebond connections 11 are made between ohmic contacts on the LED chips 22 and electrical traces 25A, 25B on the submount 23. The mounted LED chips 22 are then covered with an encapsulant 26, which may provide environmental and mechanical protection to the chips while also acting as a lens. The metal reflector 24 is typically attached to the carrier by means of a solder or epoxy bond.

While a package such as the package 20 illustrated in FIG. 1B may have certain advantages for high power operation, there may be a number of potential problems associated with using a separate metal piece as a metal reflector. For example, small metal parts may be difficult to manufacture repeatable with a high degree of precision at a reasonable expense. In addition, since the reflector is typically affixed to a carrier using an adhesive, several manufacturing steps may be required to carefully align and mount the reflector, which may add to the expense and complexity of the manufacturing process for such packages.

SUMMARY OF THE INVENTION

A light emitter package according to one embodiment of the present invention comprises the following elements. A submount is provided. A light emitter chip is mounted on the submount. A lens is disposed over the light emitter chip. The ratio of the width of the light emitter chip to the width of the lens in a given direction is 0.5 or greater.

A light emitting diode (LED) package according to an embodiment of the present invention comprises the following elements. A submount comprising top and bottom surfaces is provided. A plurality of top electrically and thermally conductive elements is disposed on the top surface of the submount. An LED chip is disposed on one of the top electrically and thermally conductive elements. The top electrically and thermally conductive elements are arranged to spread heat from the LED chip across the majority of the submount top surface. A bottom thermally conductive element is on the bottom surface and not in electrical contact with the top elements. The bottom thermally conductive element is arranged to conduct heat from the submount. A lens is disposed over the LED chip. The ratio of the width of the LED chip to the width of the lens in a given direction is 0.5 or greater.

A light emitter package according to an embodiment of the present invention comprises the following elements. A submount comprising aluminum nitride (AlN) is provided. A light emitter chip is disposed on the submount. The light emitter emitting light has an approximate average wavelength in the range of 430-460 nm. A lens is on the light emitter chip. The ratio of the width of the light emitter chip to the width of the lens in a given direction is 0.5 or greater.

A light emitter package according to an embodiment of the present invention comprises the following elements. A single light emitting diode (LED) chip is disposed on a submount having dimensions of 3.5 mm square or larger. A molded lens is disposed over the LED chip on the submount.

A light emitter package according to an embodiment of the present invention comprises the following elements. A light emitter chip is disposed on a submount comprising a material having a thermal conductivity of 30 W/m·K or higher. A molded lens is disposed over the emitter on the submount.

BRIEF DESCRIPTION OF THE DRAWINGS

FIG. 1A is a sectional view of a prior art LED package;

FIG. 1B is a sectional view of another prior art LED package;

FIG. 2 is a perspective view of one embodiment of an LED package according to the present invention without the lens;

FIG. 3 is a perspective view of the LED package shown in FIG. 2 from the opposite side;

FIG. 4 is a side view of LED package shown in FIG. 2 with a lens covering the LED chip;

FIG. 5 is a bottom perspective view of the LED package shown in FIG. 4;

FIG. 10 is a graph presenting data related to various lamps according to embodiments of the present invention;

FIG. 11 is a graph of the luminous intensity as a function of the CIE x-value of the output light for several lamps according to embodiments of the present invention;

DETAILED DESCRIPTION OF THE INVENTION

Figure 6:
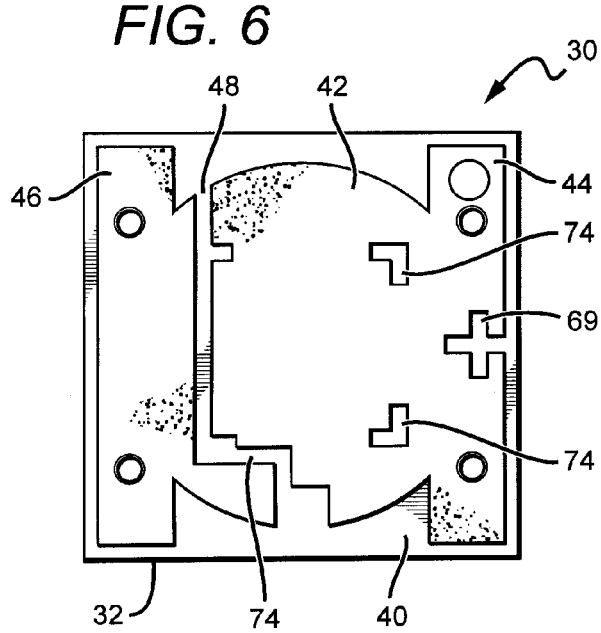
FIG. 6 shows the conductive traces on the top surface of the submount for the LED package shown in FIG. 2.
Figure 7:
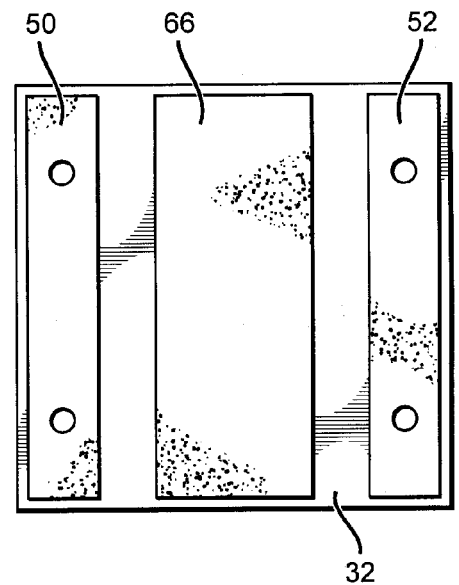
FIG. 7 shows the conductive traces on the bottom surface of the submount for the LED package shown in FIG. 2.
Figure 8:
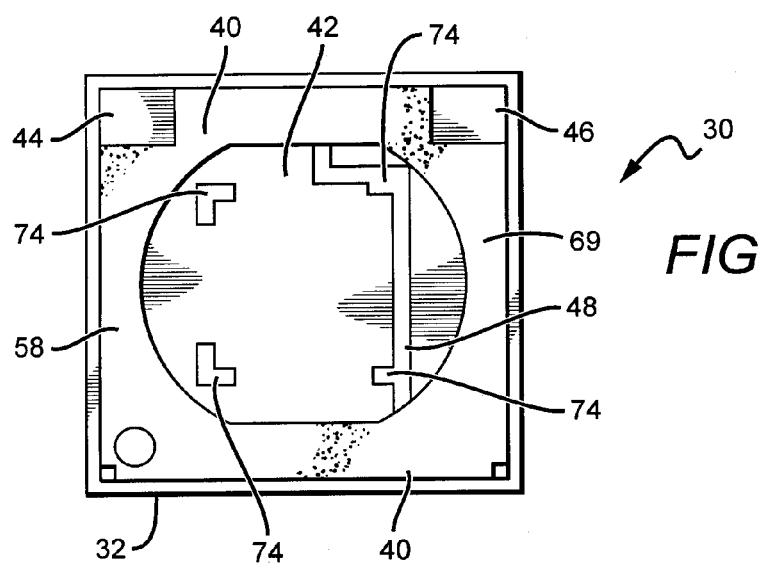
FIG. 8 shows the top surface of the LED package as shown in FIG. 6, with a solder mask.
Figure 9:
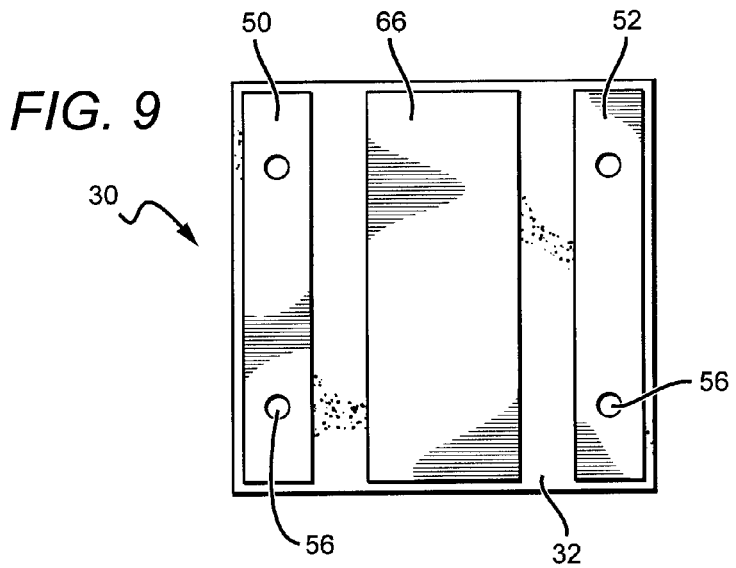
FIG. 9 shows the bottom surface of the LED package as shown in FIG. 7, with a solder mask.

The present invention is directed to compact, simple and efficient high power LED packages and methods for manufacturing same. Different embodiments can comprise one or more high power LEDs that typically operate at elevated power levels and temperatures. Packages according to the present invention can include features that allow for higher output power with still provided for thermal management by arranging features to help spread the heat from the LED. The heat can then dissipate into the ambient. The packages according to the present invention can also comprise a lens molded directly over the one or more LEDs to protect the LED while still allowing for efficient emission characteristics.

In conventional LED packages, light is most efficiently extracted through the molded lens for LEDs when the ratio of the width of the LED chip to the lens diameter is relatively low. LED chips with a smaller footprint (or width) compared to the diameter of the lens more closely emulate a point light source under the lens. This allows most LED light to reach lens surface within the critical angle for the light to escape from the lens, so that most LED light escapes to contribute to useful emission for the LED package. For LED packages having a LED chip width to lens diameter ratio of 0.4 or less, most of the light from the LED chip escapes through the lens.

It is desirable to provide high power LED packages that emit elevated levels of light while at the same time maintaining the same size LED package footprint. One way to provide an LED package that emits elevated levels of light is by utilizing larger LED chips while maintaining the size of the LED package. This typically results in LED packages having a larger LED chip width to lens diameter ratio. As this ratio becomes higher, i.e. the width of the LED chip comes closer to the diameter of the lens, output power can decrease when this ratio exceeds a certain level. This is predominantly caused by an increased amount of the LED chip light reaching the surface of the lens at an angle that is outside the critical escape angle, such that the light experiences total internal reflection (TIR). TIR light can be absorbed into the components of the LED package following reflection so that it does not have the opportunity to escape from the LED package to contribute to useful light emission. In most conventional LED packages the LED chip width to lens diameter ratio does not exceed 0.4.

Some embodiments of the present invention provide for a high power LED package utilizing an increased LED chip width to lens diameter ratio. This allows the LED packages to provide increased output power while at the same time providing an LED package footprint of the same size as lower powered LED packages. Despite the increase in TIR at the surface of the lens that can result from the increased LED chip width to lens diameter ratio, the LED packages according to the present invention are arranged with different features or characteristics that allow for an overall increase in emitted light. Some of the features include LED packages with LED chips having lower current density and/or a conversion coating utilizing having larger phosphor particle sizes.

The present invention provides low cost, relatively small size LED packages that provide an efficient but small light source. The packages according to the present invention are particularly adapted to surface mount technologies and provide features that allow for the good thermal dissipation, allowing the packages to operate at elevated power levels without overheating. The LED chips can also provide scattering features that scatter the LED chip light as it emits from the package to provide for increased uniformity. The LED chips can also provide electrostatic discharge (ESD) protection circuits to protect the LED chip from damage do to an ESD event.

The present invention is described herein with reference to certain embodiments, but it is understood that the invention can be embodied in many different forms and should not be construed as limited to the embodiments set forth herein. In particular, the present invention is described below in regards to certain LED packages in certain configurations, but it is understood that the present invention can be used for many other LED packages having many different configurations. The components can have different shapes and sizes beyond those shown and different features can be included in the LED packages to provide increased output power. The LED packages can include more than one LED chip with one or all of the LED chips being coated with a down-converter coating that can comprise a phosphor loaded binder. It is understood, however, that LED chips can be used that do not have a conversion material.

It is understood that when an element such as a layer, region or substrate is referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one layer or another region. It is understood that these terms are intended to encompass different orientations of the device in addition to the orientation depicted in the figures.

Although the terms first, second, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional view illustrations that are schematic illustrations of idealized embodiments of the invention. As such, variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention.

FIGS. 2 through 9 show different features of one embodiment of an LED package 30 according to the present invention generally comprising a substrate/submount ("submount") 32 that can hold one or more LEDs emitting the same or different colors. In the embodiment shown a single LED 34 is mounted on the submount 32. The LED 34 can have many different semiconductor layers arranged in different ways. LED structures and their fabrication and operation are generally known in the art and only briefly discussed herein. The layers of the LED 34 can be fabricated using known processes with a suitable process being fabrication using metal organic chemical vapor deposition (MOCVD). The layers of the LEDs 34 generally comprise an active layer/region sandwiched between first and second oppositely doped epitaxial layers all of which are formed successively on a growth substrate. LEDs can be formed on a wafer and then singulated for mounting in a package. It is understood that the growth substrate can remain as part of the final singulated LED or the growth substrate can be fully or partially removed. In embodiments where the growth substrate remains, it can be shaped or textured to enhance light extraction.

It is also understood that additional layers and elements can also be included in the LED 34, including but not limited to buffer, nucleation, contact and current spreading layers as well as light extraction layers and elements. It is also understood that the oppositely doped layers can comprise multiple layers and sub-layers, as well as super lattice structures and interlayers. The active region can comprise single quantum well (SQW), multiple quantum well (MQW), double heterostructure or super lattice structures. The active region and doped layers may be fabricated from different material systems, with preferred material systems being Group-III nitride based material systems. Group-III nitrides refer to those semiconductor compounds formed between nitrogen and the elements in the Group III of the periodic table, usually aluminum (Al), gallium (Ga), and indium (In). The term also refers to ternary and quaternary compounds such as aluminum gallium nitride (AlGaN) and aluminum indium gallium nitride (AlInGaN). In a preferred embodiment, the doped layers are gallium nitride (GaN) and the active region is InGaN. In alternative embodiments the doped layers may be AlGaN, aluminum gallium arsenide (AlGaAs) or aluminum gallium indium arsenide phosphide (AlGaInAsP).

The growth substrate can be made of many materials such at sapphire, silicon carbide, aluminum nitride (AlN), GaN, with a suitable substrate being a 4H polytype of silicon carbide, although other silicon carbide polytypes can also be used including 3C, 6H and 15R polytypes. Silicon carbide has certain advantages, such as a closer crystal lattice match to Group III nitrides than sapphire and results in Group III nitride films of higher quality. Silicon carbide also has a very high thermal conductivity so that the total output power of Group-III nitride devices on silicon carbide are typically not limited by the thermal dissipation of the substrate (as may be the case with some devices formed on sapphire). SiC substrates are available from Cree Research, Inc., of Durham, N.C. and methods for producing them are set forth in the scientific literature as well as in a U.S. Pat. Nos. Re. 34,861; 4,946,547; and 5,200,022.

The LED 34 can also comprise a conductive current spreading structure 36 on its top surface, as well as one or more contacts 38 accessible at its top surface for wire bonding. The spreading structure 36 and contact can both be made of a conductive material such as Au, Cu, Ni, In, Al, Ag or combinations thereof, conducting oxides and transparent conducting oxides. The current spreading structure 36 generally comprises conductive fingers 37 arranged in a grid on the LED 34 with the fingers spaced to enhance current spreading from the contacts 38 into the LED's top surface. In operation, an electrical signal is applied to the contacts 38 through a wire bond as described below, and the electrical signal spreads through the fingers 37 of the current spreading structure 36 and the top surface into the LED 34. Current spreading structures are often used in LEDs where the top surface is p-type, but can also be used for n-type materials.

The LED can be coated with one or more phosphors with the phosphors absorbing at least some of the LED light and emitting a different wavelength of light such that the LED emits a combination of light from the LED and the phosphor. In a preferred embodiment the LED emits a white light combination of LED and phosphor light. The LED can be coated using many different methods and with many different conversion materials, with suitable methods and materials being described in U.S. patent application Ser. Nos. 11/656,759 and 11/899,790, both entitled "Wafer Level Phosphor Coating Method and Devices Fabricated Utilizing Method", and both of which are incorporated herein by reference. Alternatively the LEDs can be coated using other methods such an electrophoretic deposition (EPD), with a suitable EPD method described in U.S. patent application Ser. No. 11/473,089 entitled "Close Loop Electrophoretic Deposition of Semiconductor Devices", which is also incorporated herein by reference. It is understood that LED packages according to the present invention can also have multiple LEDs of different colors, one or more of which may be white emitting.

The submount 32 can be formed of many different materials with a preferred material being electrically insulating. Suitable materials include, but are not limited to ceramic materials such as aluminum oxide, aluminum nitride or organic insulators like polyimide (PI) and polyphthalamide (PPA). In other embodiments the submount 32 can comprise a printed circuit board (PCB), sapphire or silicon or any other suitable material, such as T-Clad thermal clad insulated substrate material, available from The Bergquist Company of Chanhassen, Minn. For PCB embodiments different PCB types can be used such as standard FR-4 PCB, metal core PCB, or any other type of printed circuit board. LED packages according to the present invention can be fabricated using a method that utilizes a submount panel sized to accommodate a plurality of submounts. Multiple LED packages can be formed on the panel, with the individual packages being singulated from the panel.

As noted, many materials can be used to fabricate the submount element. In various embodiments, it is desirable to have a submount that is a good electrical insulator with low thermal resistance or high thermal conductivity (e.g., aluminum nitride). Some materials that may be used have a thermal conductivity of approximately 30 W/m·K or higher, such as zinc oxide (ZnO). Other acceptable materials have thermal conductivities of approximately 120 W/m·K or higher, such as aluminum nitride (AlN) which has a thermal conductivity that can range from 140-180 W/m·K. In terms of thermal resistance, some acceptable materials have a thermal resistance of 2° C./W or lower. Other materials may also be used that have thermal characteristics outside the ranges discussed herein.

Figure 12:
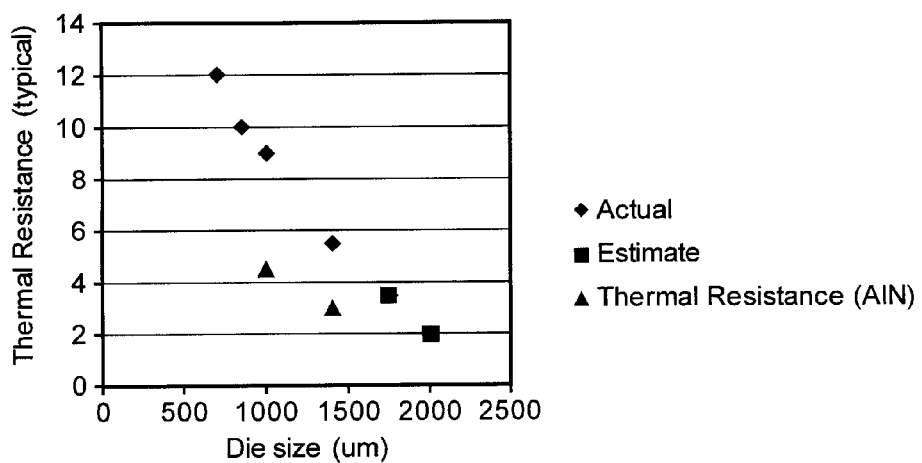
FIG. 12 is a graph of thermal resistance as a function of chip size.

FIG. 12 shows thermal resistance in ° C./W as a function of chip size in a package. The data represents four actual devices having ceramic submounts shown as diamonds and two actual devices having aluminum nitride submounts. The data for the ceramic submounts has been extrapolated out to estimate the thermal resistance for two larger chips. The data show that thermal resistance is reduced as chip size increases. Also the thermal resistance is lower for the chips with aluminum nitride submounts as compared to similarly sized chips with ceramic submounts. The data in FIG. 12 is included to support the general propositions discussed above. It is understood that the data should not limit the scope of any embodiments of the present invention.

A submount having these properties allows for a device package in which the LED can be operated with higher drive currents. Because the submount has a relatively low thermal resistance, the additional heat generated by the higher drive current is more easily dissipated into the ambient. A higher drive current can produce a brighter output from the LED. Similarly, a device incorporating a low thermal resistance submount can be operated at a given drive current for a longer period of time when compared to a device having a submount with a higher thermal resistance. That is, the lifetime and reliability of the device can be increased. Additionally, devices having a low thermal resistance submount can operate in higher ambient (or background) temperatures, making them useful in applications designed for harsh environmental conditions.

In devices according to one embodiment, an output power of greater than 150 lumens/watt of white emission within a 7-step MacAdams ellipse along the black body curve has been achieved using an 3.5 mm square aluminum nitride (AlN) submount in combination with a 1.4 mm square LED chip. This device may be scalable to achieve similar results at larger submount/LED size combinations.

In some embodiments it may be advantageous to use LED chips emitting light having an average wavelength in the range of 430-460 nm. In some cases the ranges may be narrower, for example, 430-450 nm or 440-445 nm. LEDs emitting at shorter wavelengths, such as the ranges given, may exhibit better brightness and/or reliability when operated at higher ambient temperatures as compared to LEDs emitting light having a longer average wavelength and operating at the same temperature.

Figure 13:
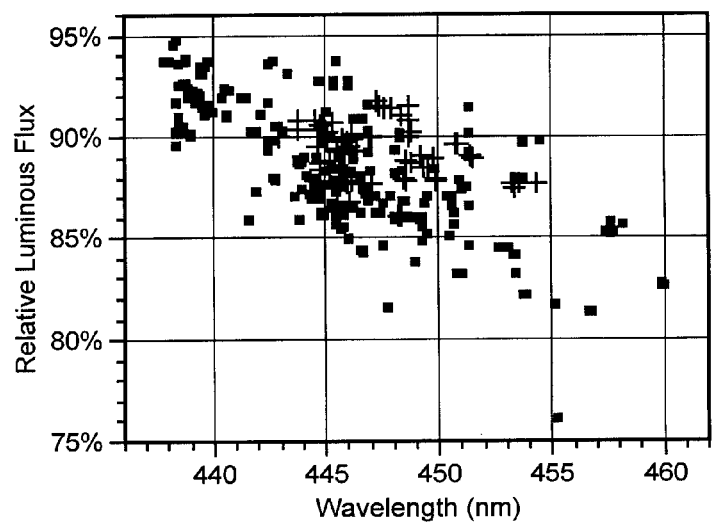
FIG. 13 a graph of relative luminous flux expressed as a percent versus wavelength in nanometers for several LED devices according to embodiments of the present invention.

FIG. 13 shows a graph of relative luminous flux expressed as a percent versus wavelength in nanometers for several LED devices that might be used in LED packages according to embodiments of the invention. The relative luminous flux was calculated by dividing the luminous flux at a temperature of 80° C. (measured at a solder point) by the luminous flux at room temperature and expressing the quotient as a percentage. Thus, in some embodiments LED chips emitting shorter wavelength light may be desirable to increase brightness and reliability.

As best shown in FIG. 4, an optical element or lens 70 is formed on the top surface 40 of the submount 32, over the LED 34, to provide both environmental and/or mechanical protection. The lens 70 can be in different locations on the top surface 40 with the lens located as shown with at approximately the center of the submount 32, with the LED 34 at approximately the center of the lens base. In some embodiments the lens can be formed in direct contact with the LED 34 and the submount's top surface 40. In other embodiments there may be an intervening material or layer between the LED 34 and top surface 40. Direct contact to the LED 34 provides certain advantages such as improved light extraction and ease of fabricating.

The lens 70 can be molded using different molding techniques such as those described in U.S. patent application Ser. No. 11/982,275 entitled "Light Emitting Diode Package and Method for Fabricating Same", which is incorporated herein by reference. The lens can be many different shapes depending on the desired shape of the light output. One suitable shape as shown is hemispheric, with some examples of alternative shapes being ellipsoid bullet, flat, hex-shaped and square. Many different materials can be used for the lens such as silicones, plastics, epoxies or glass, with a suitable material being compatible with molding processes. Silicone is suitable for molding and provides suitable optical transmission properties. It can also withstand subsequent reflow processes and does not significantly degrade over time. It is understood that the lens 70 can also be textured to improve light extraction or can contain materials such as phosphors or scattering particles. In some embodiments, the lens 70 can comprise two portions: a flat portion 70a and a dome portion 70b. The flat portion 70a is disposed over the LED 34, with the dome portion 70b positioned on the flat portion 70a. These portions 70a, 70b can be made from the same material or they may be made of two different materials.

The LED package 30 can also comprise a protective layer 74 covering the submount's top surface 40 between the lens 70 and edge of the submount 32. The layer 74 provides additional protection to the elements on the top surface to reduce damage and contamination during subsequent processing steps and use. Protective layer 74 can be formed during formation of the lens 70 and can comprise the same material as the lens 70. It is understood, however, that the LED package 30 can also be provided without the protective layer 74.

The lens 70 should also be able to withstand certain sheer forces before being displaced from the submount 32. In one embodiment, the lens can withstand a 1 kilogram (kg) or more sheer force. In embodiments of the LED package using silicones that are harder after curing and have a higher durometer reading, such as Shore A 70 or higher, tend to better withstand sheer forces. Properties such as high adhesion and high tensile strength may also contribute to the ability of the lens to withstand sheer forces.

The lens arrangement of the LED package 30 is also easily adapted for use with secondary lens or optics that can be included over the lens by the end user to facilitate beam shaping. These secondary lenses are generally known in the art, with many of them being commercially available.

The present invention can be used in LED packages having different sizes or footprints, with one important factor being the ratio between the LED chip width (W) and the diameter or width of the lens (D) in a given direction. In one embodiment of package 30 the footprint can be essentially the same dimension as the effective heat spreading area in the first and second attach pads 42, 44, and 46. As described above, different embodiments of the present invention are directed to providing LED packages having increased power output while maintaining the same LED package size or footprint. By maintaining the same package footprint, the lens would generally have the same size. As mentioned above, one way to increase output power is to increase the size (i.e. width W) of the LED chip in LED package. That is, for different embodiments according to the present invention the surface area of the LED covers an increased percentage of the surface area of the LED packages submount. In some embodiments according to the present invention the surface area of the LED chip covers more than 10% of the submounts surface area, while in other embodiments it covers more than 15% of the submounts surface area.

FIG. 4 shows the chip width W and lens diameter D. LED package embodiments according to the present invention can have different W to D ratios, with some embodiments having a ratio greater than 0.5. One embodiment of an LED package 30 according to the present invention can comprise a submount 32 that is approximately 3.45 mm square (i.e., 3.45 mm×3.45 mm) and a lens having a diameter of approximately 2.55 mm. In conventional LED packages this size of submount would hold a LED chip having a size in the range of 0.7 to 1.0 mm square. The LED package 30 is arranged to hold a larger LED chip that is approximately 1.4 mm square such that the W to D ratio is 0.55. In this embodiment, the LED chip's surface area covers more than 16% of the submount's surface area.

In other embodiments, a submount having dimensions of 5 mm square is desirable. Such a submount can accommodate larger LED chip sizes including 1.75 mm square, 2 mm square, and 3 mm square. One example of a submount/LED chip combination is a 5 mm square submount with a 1.75 mm square LED chip. In one particular embodiment a 2 mm square LED chip is used in combination with a 5 mm square aluminum nitride submount. In another particular embodiment a 3 mm chip is used with a 5 mm submount. For the 5 mm submount packages, a molded lens having a diameter of approximately 4.52 mm is disposed over the chip. The given sizes are exemplary. It is understood that larger or smaller lenses, submounts, and LED chips are possible and that many different combinations of lenses, submounts, and LED chips having various sizes are possible. Furthermore, although the submounts discussed herein refer to dimensions indicating a square shaped submount, it is understood that other submounts may have a circular or rectangular shape, for example.

Several LED devices according to embodiments of the present invention which include 2 mm square chips were built and tested. Devices exhibiting a luminous flux of 160 lm or higher at efficacies of 160 lm/W or higher were achieved with a drive current of 350 mA. Devices exhibiting a luminous flux of 750 lm or higher at efficacies of 110 lm/W or higher were achieved with a drive current of 2 A. For example, a 2 mm square chip device was manufactured that was measured to output 168.5 lm at a drive current of 350 mA and a voltage of 2.86 V for 168 lm/W. Another 2 mm square chip was fabricated that was measured to output 791.6 lm at a drive current of 2001 mA and a voltage of 3.4 V for 116 lm/W. Chips with similar characteristics may be used in LED packages according to embodiments of the present invention.

As described above, increasing the ratio of W to D can result in an overall decrease in output power as a result of TIR of the LED chip light at the surface of the lens. LED packages according to the present invention can have additional features that overcome the decrease associated with TIR to provide an overall increase in output power compared to LED packages with a smaller W to D ratio. In one embodiment, the overall increase can be partially attributable to lower overall current density based on the increases LED chip area. Decreased current density can provide for increased LED chip emission efficiency. In the embodiment described above, the increase in LED chip size from a conventional 0.7 mm or 1.0 mm LED chip to the larger 1.4 mm LED chip can result in reduced current density that provides an overall approximate output power increase of 6%.

FIG. 10 is a graph presenting data related to various lamps that were built and tested which embody aspects of the present invention. The color points of the output light from several lamps are plotted on a portion of the 1931 CIE Curve with an overlay indicating some of Cree's standard white light chromaticity regions (bins). For this particular set of lamps, the color points are distributed over several standard Cree bins (i.e., WK, WB, WE, WC, WF and WG) in the white light region of the CIE Curve. The large data point found within the WG bin corresponds to a lamp which exhibited a luminous flux of approximately 148 lm as best shown in FIG. 11.

FIG. 11 shows a graph of the luminous intensity as a function of the CIE x-value of the output light for several lamps embodying aspects of the present invention which were produced and tested. The graph shows lamps ranging in luminous flux from approximately 127-149 lm. These particular lamps were driven with a current of 350 mA. It is understood that a higher drive current would yield a higher luminous flux. As noted above, the large data point represents a lamp which corresponds to a CIE x-value of approximately 0.32, having a luminous flux of approximately 148 lm. As shown in FIG. 10, this particular lamp has a color point that falls within Cree's WG white light bin. All of the lamps in FIGS. 10 and 11 were produced to have a given submount size (footprint) of approximately 3.45 mm×3.45 mm. From the data, it is possible to establish a minimum ratio of luminous flux to footprint size for a given x-value on the CIE Curve. For example, a lamp having output light with a CIE x-value of approximately 0.286 exhibited a ratio of luminous flux to footprint size of approximately:

$$127 \text{ lm}/(3.45 \text{ mm})^2 \approx 10.67 \text{ lm/mm}^2$$

In another example, a different lamp having a CIE x-value of approximately 0.32 exhibited a ratio of luminous flux to footprint size of approximately:

$$148 \text{ lm}/(3.45 \text{ mm})^2 \approx 12.43 \text{ lm/mm}^2$$

The luminous flux of the lamps can be increased by increasing the footprint size according to the exemplary minimum ratios. It is understood that these examples are only meant to establish minimum ratios of luminous power to footprint size for a given CIE x-value. Higher luminous fluxes and, hence, higher ratios are possible. Furthermore, although not shown in FIGS. 10 and 11, it is possible to establish ratios of luminous flux to footprint size for various y-values on the CIE Curve and various x-y paired values (color points) on the CIE curve.

In other embodiments, the overall increase in emission efficiency can be attributable to the use of larger sized phosphor particles for the conversion material. Many conventional LED chips utilize a conversion material with particle sizes of approximately 5 microns. Some embodiments according to the present invention utilize a conversion material having a $D_{50}$ phosphor particle size of greater than 5 microns, with suitable conversion materials having a $D_{50}$ phosphor particle size of greater than 10 microns; other embodiments may include particle sizes of approximately 20 microns or greater. In one embodiment according to the present invention, the conversion material comprises YAG having a $D_{50}$ particle size of approximately 16 microns. In some embodiments the use of increased phosphor particle sizes can result in increased power output of 8% or more. These embodiments provide for a relatively small overall lens combined with a phosphor having a relatively large $D_{50}$ particle size, independent of chip size. In some embodiments, the ratio of $D_{50}$ particle size of at least 10 microns to lens diameter or width of 2.55 mm (or 2550 microns) can be greater than approximately 0.4%. In other embodiments, the ratio of D50 particle size of at least 16 microns to lens diameter or width of 2.55 mm can be greater than 0.6%.

Although applicant does not want to be bound by any one theory, it is believed that this increase is due to the fact that larger particle sizes typically do not backscatter as much LED light as smaller sized phosphor particles. As a result, less light is absorbed by the LED chip or the other LED package components after it is backscattered. In some embodiments, however, this can result in reduced emission uniformity from the LED package with one possible reason being that less light is backscattered and as a result there is less opportunity to mix the LED light and downconverted light from conversion material. The relationship between emission efficiency and phosphor particle size may be related to the defect density on or within a phosphor particle. Phosphor defects tend to be more concentrated on the surfaces of a phosphor particle and therefore as particle sizes increase the defect density decreases. Stated differently, a conversion material with a larger average phosphor particle size may have a lower total number of defects. Some of the surface densities can include surface roughness, dislocations, cracks or impurities. Some of the internal phosphor particle defects can comprise bubbles, delaminations, or impurities. In some embodiments, an increase in emission efficiency may be attained by providing a conversion material that includes a phosphor with reduced surface defects for any average particle size, such as a $D_{50}$ as low as 3 microns or as high as 25 microns. The use of larger is phosphor particles greater that 10 microns is described in U.S. patent application Ser. No. 12/024,400, entitled "Semiconductor Light Emitting Devices With High Color Rendering", which is incorporated herein by reference.

The above are only two of the features or characteristics for LED packages according to the present invention that can lead to an overall increase in light emission.

In some applications the decreased emission uniformity mentioned above can be acceptable in certain applications such as in street lighting. In other embodiments the decreased emission uniformity can be compensated for at the systems level using different mechanisms such as diffusers or scattering elements. To provide improved uniformity at the LED package level, scattering materials can be provided in different locations in the LED package. In some embodiments, the scattering material can be in the conversion material, while in other embodiments it can be included in or on the lens. In still other embodiments it can comprise a layer of material on the top of the LED chip. Scattering particles can comprise many different materials, including:

silica gel;
zinc oxide (ZnO);
yttrium oxide ($Y_2O_3$);
titanium dioxide ($TiO_2$);
barium sulfate ($BaSO_4$);
alumina ($Al_2O_3$);
fused silica ($SiO_2$);
fumed silica ($SiO_2$);
aluminum nitride;
glass beads;
zirconium dioxide ($ZrO_2$);
silicon carbide (SiC);
tantalum oxide ($TaO_5$);
silicon nitride ($Si_3N_4$);
niobium oxide ($Nb_2O_5$);
boron nitride (BN); or
phosphor particles (e.g., YAG:Ce, BOSE)

Other materials not listed may also be used and various combinations of materials may be used to achieve a particular scattering effect. In one embodiment, the scattering particles can comprise a $D_{50}$ particle size of larger than approximately 4 microns. A suitable embodiment comprises a $D_{50}$ particle size in the range of 15-20 microns, with one embodiment $D_{50}$ particle size of larger than approximately 4 microns having a $D_{50}$ particle size approximately the same size as the conversion materials $D_{50}$ particle size.

Similar to the larger sized phosphor particles, it is believed that the larger sized scattering particles result in reduced backscattering due to reduced particle defects. With less backscattering there can be less opportunity for light to be absorbed in the LED chip components. This reduced backscattering can also result in less opportunity for light to mix, thereby reducing the overall mixing efficiency of the scattering particle. Light from the LED chip, however, interacts with the phosphor particles in such a way that light is redirected the scattering particles with most of the light not being backscattered. The scattering particles can also be arranged so light from the LED chip interacts with the scattering particles a limited number of times to further reduce the possibility of backscattering. This can be accomplished by controlling the scattering particle layer thickness or concentration of scattering particles. This redirecting of light while controlling the number of light interactions can result in light that is substantially forward scattered.

Different embodiments according to the present invention can have a conversion material with larger phosphor particles as described above, so that most of the light converted by the phosphor particles is not backscattered. That is, the light is forward converted to increase efficiency. To achieve the desired emission uniformity, a scattering material can be included that also has the characteristic of most of the light not being backscattered. That is, the light is forward scattered. The increased efficiency with the desired emission uniformity of these embodiments can be attributable to forward light conversion followed by forward scattering.

LED packages according to the present invention also comprise heat management features to allow operation at elevated temperatures. As best shown in FIG. 6 (but partially shown in other figures), the top surface 40 of the submount 32 comprises patterned conductive features that can include a die attach pad 42 with an integral first contact pad 44. A second contact pad 46 is also included on the submount's top surface 40 with the LED 34 mounted approximately at the center of the attach pad 42. These patterned conductive features provide conductive paths for electrical connection to the LED 34 using known contacting methods. The LED can be mounted to the attach pad 42 using known methods and material mounting such as using conventional solder materials that may or may not contain a flux material or dispensed polymeric materials that may be thermally and electrically conductive.

The attach pad 42 and first and second contact pads 44, 46 can comprise much different material such as metals or other conductive materials. In one embodiment the pads 42, 44, 46 comprise copper deposited using known techniques such as plating. In typical plating process a titanium adhesion layer and copper seed layer are sequentially sputtered onto a substrate. Then, approximately 75 microns of copper is plated onto the copper seed layer. The resulting copper layer being deposited can then be patterned using standard lithographic processes. In other embodiments the layer can be sputtered using a mask to form the desired pattern.

In some embodiments according to the present invention some of the conductive features can include only copper, with others of the features including additional materials. For example, the attach pad 42 can be plated or coated with additional metals or materials to the make the attach pad 42 more suitable for mounting an LED 34. For example, the attach pad 42 can be plated with adhesive or bonding materials, or reflective and barrier layers.

A gap 48 (best shown in FIGS. 6 and 8) is included between the second pad 46 and the attach pad 42 down to the surface of the submount 32 that, with the gap providing electrical isolation between the attach pad 42 and second pad 46. As further described below, an electrical signal is applied to the LED 34 through the second pad 46 and the first pad 44, with the electrical signal on the first pad 44 passing directly to the LED 34 through the attach pad 42 and the signal from the second pad passing into the LED 34 through wire bonds. The gap 48 provides electrical isolation between the second pad and attach pad to prevent shorting of the signal applied to the LED 34.

In some embodiments and electrical signal can be applied to the package 30 by providing external electrical contact to the first and second bond pads 44, 46 such as by solder contacts or other conductive paths to a PCB. In the embodiment shown the LED package 30 is arranged for mounting using surface mount technology and having internal conductive paths. The LED 30 comprises first and second surface mount pads 50, 52 (best shown in FIGS. 5, 7 and 9) that can be formed on the submount's back surface 54, at least partially in alignment with the first and second contact pads 44, 46, respectfully. Electrically conductive vias 56 are formed through the submount 32 between the first mounting pad 50 and the first contact pad 44, such that when a signal is applied to the first mounting pad 50 is conducted to first contact pad 44. Similarly, conductive vias 56 are formed between the second mounting pad 52 and second contact pad to conduct an electrical signal between the two. The first and second mounting pads 50, 52 allow for surface mounting of the LED package 30 with the electrical signal to be applied to the LED 34 applied across the first and second mounting pads 50, 52. The vias 56 and contact pads 44,46 can made of many different materials deposited using different techniques, such as those used for the attach and contact pads 42, 44, 46.

It is understood that the mounting pads 50, 52 and vias 56 can be arranged in many different ways and can have many different shapes and sizes. It is also understood that instead of vias, one or more conductive traces can be provided on the surface of the submount between the mounting pads and contact pads, such as along the side surface of the submount.

Referring now to FIGS. 2, 3, 8 and 9, a solder mask 58 made of conventional materials can be included on the submount's top surface 40, at least partially covering the attach pad 42 and the first and second contact pads 44, 46, and at least partially covering the gap 48. The solder mask 58 protects these features during subsequent processing steps and in particular mounting the LED 34 to the attach pad 42 and wire bonding. During these steps there can be a danger of solder or other materials depositing in undesired areas, which can result in damage to the areas or result in electrical shorting. The solder mask serves as an insulating and protective material that can reduce or prevent these dangers. The solder mask comprises opening for mounting the LED 34 to the attach pad 42 and for attaching wire bonds to the second contact pad 46. It also comprises side openings 60 to allow convenient electrical access to the contact pads 44, 46 for testing the package 30 during fabrication. The solder mask 58 also has alignment holes that provide for alignment during fabrication of the package 30 and also allow for alignment when mounted in place by the end user.

Referring now to FIG. 6, in some embodiments the conductive traces can be provided with a symbol or indicator 69 to illustrate which side of the LED package 30 should be coupled to the plus or minus of the signal to be applied to the package. This can ensure accurate mounting of the LED package 30 to a PCB or other fixture, whether by machine or hand. In the embodiment shown the symbol 69 comprises a plus (+) sign over the first contact pad 44, indicating that the package 30 should be mounted with the positive of the signal coupled to the first surface mount pad 52. The minus of the signal would then be coupled to the second mount pad 54. It is understood that many different symbol types can be used and that a symbol can also be included over the second conductive pad 46. It is also understood that the symbols can be placed in other locations other than the solder mask 58.

The package 30 can also comprise elements to protect against damage from electrostatic discharge (ESD). In the embodiment the ESD element is on-chip, and different elements can be used such as various vertical silicon (Si) Zener diodes, different LEDs arranged in parallel and reverse biased to the LED 34, surface mount varistors and lateral Si diodes. In the embodiment shown a Zener diode 62 is utilized and is mounted to the attach pad 42 using known mounting techniques. The diode is relatively small so that it does not cover an excessive area on the surface of the submount 32. In the embodiment shown, the diode 62 is mounted adjacent to the LED chip 34 and in some embodiments it can be on a separate attach pad. The diode 62 should be mounted to the submount 32 as close as possible to the center of submount's center without interfering with other components of the LED package 30.

It is noted that the solder mask 58 includes an opening for the ESD diode 62 so that it can be mounted to the attach pad 42. Different mounting materials and methods can be used such as those used to mount the LED 34 to the attach pad 42. An ESD wire bond 64 is included between the second contact pad 46 at the solder mask opening and the ESD diode 62. Two LED wire bonds 65 are also included between the solder mask opening in the second contact pad 46 and wire bond pads 38 on the LED 34. In other embodiments only one wire bond can be included between the LED 34 and second contact pad. This LED 34 and ESD diode 62 arrangement allows excessive voltage and or current passing through the LED package 30 from an ESD event to pass through the diode 62 instead of the LED 34, protecting the LED 34 from damage. The wire bonds 64 and 65 can be applied using known methods and can comprise known conductive materials, with a suitable material being gold (Au). It is understood that in other embodiments of an LED package according to the present invention can be provided without an ESD element/diode or with an ESD element/diode that is external to the LED package 30.

As mentioned above, heat typically does not spread efficiently into the submount 32, particularly those made of materials such as ceramic. When a LED is provided on an attach pad that extends generally only under the LED, heat does not spread through most of the submount, and is generally concentrated to the area just below the LED. This can cause overheating of the LED which can limit the operating power level for the LED package.

To improve heat dissipation in the LED package 30 the pads 42, 44, 46 provide extending thermally conductive paths to conduct heat away from the LED 34 such that it can spread to other areas of the submount beyond the areas just below the LED 34. The attach pad 42 covers more of the surface of the submount 32 than the LED 34, with the attach pad extending from the edges of the LED 34 toward the edges of the submount 32. In the embodiment shown, the attach pad 42 is generally circular and extending radially from LED 34 toward the edges of the submount 32. A portion of the attach pad 42 intersects with the first and second contact pads 44, 46, with the gap 48 separating part of the attach pad adjacent to the second contact pad 46. It is understood that the contact pad 42 can be many other shapes and in some embodiments can extend to the edge of the submount 32. The contact pads 44, 46 also cover the surface of the submount 32 between the vias 56 and the edges of the submount 32. By extending the pads 42, 44 and 46 this way, the heat spreading from the LED 34 is improved. This improves thermal dissipation of heat generated in the LED 34, which improves its operating life and allows for higher operating power. The pads 42, 44, and 46 can cover different percentages of the top surface 40 of the submount 32, with a typical coverage area being greater than 50%. In other embodiments the coverage area can be greater than 75%.

The LED package 30 further comprises a metalized area 66 (best shown in FIGS. 5 and 9) on the back surface of the submount 32, between the first and second mounting pads 50, 52. The metalized area is preferably made of a heat conductive material and is preferably in at least partial vertical alignment with the LED 34. In one embodiment, the metalized area is not in electrical contact with the elements on top surface of the submount or the first and second mounting pads on the back surface of the submount 32. Although heat from the LED is spread over the top surface of the submount by the attach pad 42 and the pads 44, 46 more heat will pass into the submount 32 directly below and around the LED 34. The metalized area can assist with this dissipation by allowing this heat to spread into the metalized area where it can dissipate more readily. It is also noted that the heat can conduct from the top surface of the submount 32, through the vias 56, where the heat can spread into the first and second mounting pads 50, 52 where it can also dissipate. For the package 30 used in surface mounting, the thickness of the metalized area 66 and the first and second pads 50, 52 should be approximately the same such that all three make contact to a lateral surface such as a PCB. It is also understood that thermal vias can be included between the attach pad and different features of the LED package 30 to dissipate heat from the LED chip 34. In one embodiment, thermal vias (not shown) can be included that pass through the submount between the attach pad 42 and the metalized area 66 such that heat will more efficiently spread from the LED chip 34 through the submount 32 and to the metalized area 66.

The LED package according to the present invention can also include additional features to aid in the manufacturing accuracy and reliability. As the ratio of W to D increases, the width of the LED chip 34 becomes closer to the diameter of the lens 70. As a result, it can become more important to properly align the LED chip 34 in the center of the submount 32 so that it is below the lens 70. To aid in this alignment, the attach pad 42 had LED alignment features that can take many different forms, shapes and sizes and in the embodiment shown comprise square cut-outs 74. When mounting the LED chip to that attach pad, the corners of the LED chip fit on the inside edge of the cut-outs for proper alignment.

The LED package can also include features such as solder dams in the area around the attach pad 42, with the solder dams also serving to help center the LED and to reduce movement of the LED from the mounting area during while the mounting solder is in liquid form. When the liquid solder encounters any one of the dams, movement past is slowed or stopped. This helps reduce the movement of the LED until the solder hardens.

In other embodiments the shape of the lens over the LED chip can change to assist in light emitting efficiency. As one example, the radius of curvature for the lens can be varied, with one embodiment having an increased radius of curvature.

Although the present invention has been described in detail with reference to certain preferred configurations thereof, other versions are possible. Therefore, the spirit and scope of the invention should not be limited to the versions described above.

We claim:

1. A light emitter package, comprising:
   a submount;
   a light emitter chip mounted on said submount;
   a lens over said light emitter chip, the ratio of the width of said light emitter chip to the width of said lens in a given direction being 0.5 or greater;
   wherein the ratio of the width of said light emitter chip to the width of said submount in a given direction is 0.35 or more.

2. The light emitter package of claim 1, wherein a current density in said light emitter chip is lower compared to a light emitter chip with a smaller width.

3. The light emitter package of claim 1, further comprising a conversion material proximate to said light emitter chip, said conversion material comprising phosphor particles comprising a $D_{50}$ particle size of greater than 10 microns.

4. The light emitter package of claim 3, further comprising scattering particles.

5. The light emitter package of claim 4, wherein said scattering particles are substantially the same size as said phosphor particles.

6. The light emitter package of claim 1, said light emitter package emitting higher light output power compared to a light emitter package having a smaller light emitter chip with similar features.

7. The light emitter package of claim 1, further comprising chip alignment features on said submount.

8. The light emitter package of claim 1, further comprising an electrostatic discharge (ESD) protection device.

9. The light emitter package of claim 1, said submount comprising aluminum nitride (AlN).

10. The light emitter package of claim 1, said light emitter chip emitting light comprising an average wavelength of approximately 430-460 nm.

11. The light emitter package of claim 1, said submount comprising dimensions of approximately 3.5 mm square to 5 mm square.

12. The light emitter package of claim 1, said light emitter chip comprising dimensions of approximately 0.7 mm square to 3 mm square.

13. The light emitter package of claim 1, said light emitter chip being approximately 1.4 mm square, said submount being approximately 3 mm square.

14. The light emitter package of claim 13, said package exhibiting an output power 150 lumens/watt or higher during operation.

15. The light emitter package of claim 1, said light emitter chip being approximately 1.75 mm square, said submount being approximately 5 mm square.

16. The light emitter package of claim 1, said light emitter chip being approximately 2 mm square, said submount being approximately 5 mm square.

17. The light emitter package of claim 16, said package exhibiting higher than 150 lumens/watt during operation.

18. The light emitter package of claim 1, said light emitter chip being approximately 3 mm square, said submount being approximately 5 mm square.

19. The light emitter package of claim 18, said package exhibiting higher than 150 lumens/watt during operation.

20. The light emitter package of claim 1, said light emitter chip comprising a light emitting diode (LED) chip.

21. The light emitter package of claim 1, wherein said light emitter chip covers more than 10% of the surface area of said submount.

22. The light emitter package of claim 1, wherein said light emitter chip covers more than 15% of the surface area of said submount.

23. The light emitter package of claim 1, further comprising an intervening layer between said lens and said LED chip.

24. The light emitter package of claim 23, wherein said intervening layer comprises phosphor.

25. A light emitting diode (LED) package, comprising:
a submount comprising a top and bottom surface;
a plurality of top electrically and thermally conductive elements on said top surface of said submount;
an LED chip on one of said top elements, said top elements configured to spread heat from said LED chip across the majority of said submount top surface;
a bottom thermally conductive element on said bottom surface not in electrical contact with said top elements and configured to conduct heat from said submount; and
a lens over said LED chip;
wherein the ratio of the width of said LED chip to the width of said lens in a given direction is 0.5 or greater;
wherein the ratio of the width of said LED chip to the width of said submount in a given direction is 0.35 or more.

26. The LED package of claim 25, wherein said LED chip covers more than 10% of the surface area of said submount.

27. The LED package of claim 25, wherein said LED chip covers more than 15% of the surface area of said submount.

28. The LED package of claim 25, further comprising a conversion material proximate to said LED chip, said conversion material comprising phosphor particles comprising a $D_{50}$ particle size of greater than 10 microns.

29. The LED package of claim 28, further comprising scattering particles.

30. The LED package of claim 29, wherein said scattering particles are substantially the same size as said phosphor particles.

31. The LED package of claim 25, said LED package emitting higher light output power compared to an LED package having a smaller LED chip with similar features.

32. The LED package of claim 25, further comprising chip alignment features on said submount.

33. The LED package of claim 25, further comprising an electrostatic discharge (ESD) protection device.

34. The LED package of claim 25, said submount comprising aluminum nitride (AlN).

35. The LED package of claim 25, said LED chip emitting light comprising an average wavelength of approximately 430-460 nm.

36. The LED package of claim 25, said submount comprising dimensions of approximately 3.5 mm square to 5 mm square.

37. The LED package of claim 25, said LED chip comprising dimensions of approximately 0.7 mm square to 3 mm square.

38. The LED package of claim 25, said LED chip being approximately 1.4 mm square, said submount being approximately 3 mm square.

39. The LED package of claim 38, said LED package exhibiting an output power of 150 lumens/watt or greater during operation.

40. The LED package of claim 25, said LED chip being approximately 1.75 mm square, said submount being approximately 5 mm square.

41. The LED package of claim 25, said LED chip being approximately 2 mm square, said submount being approximately 5 mm square.

42. The LED package of claim 41, said LED package exhibiting an output power of 150 lumens/watt or greater during operation.

43. The LED package of claim 25, wherein said top elements cover more that 50% of said submount top surface.

44. The LED package of claim 25, further comprising first and second mounting pads on said bottom surface and a plurality of conductive vias running though said submount.

45. The LED package of claim 25, further comprising a solder mask covering at least a portion of said top elements.

46. The LED package of claim 25, further comprising a protective layer between the edge of said lens and the edge of said top surface, said protective layer covering said submount top surface and said top elements.

47. The light emitter package of claim 25, further comprising an intervening layer between said lens and said LED chip.

48. The light emitter package of claim 47, wherein said intervening layer comprises phosphor.

49. A light emitter package, comprising:
a submount comprising aluminum nitride (AlN);
a light emitter chip on said submount, said light emitter chip emitting light comprising an approximate average wavelength in the range of 430-460 nm;
a lens on said light emitter chip; wherein the ratio of the width of said light emitter chip to the width of said lens in a given direction is 0.5 or greater;
wherein the ratio of the width of said light emitter chip to the width of said submount in a given direction is 0.35 or more.

50. A light emitter package, comprising:
a single light emitting diode (LED) chip;
a submount comprising dimensions of 3.5 mm square or larger;
a molded lens on said LED chip on said submount, such that a portion of said molded lens and LED chip are mounted on the same planar surface of said submount wherein the ratio of the width of said light emitter chip to the width of said lens in a given direction is 0.5 or greater and wherein the ratio of the width of said light emitter chip to the width of said submount in a given direction is 0.35 or more.

51. The light emitter package of claim 50, said submount comprising dimensions of approximately 5 mm square, said LED chip comprising dimensions of approximately 2 mm square, and said molded lens comprising a diameter of approximately 4.52 mm.

52. The light emitter package of claim 50, said submount comprising aluminum nitride.

53. The light emitter package of claim 50, said package outputting white light at an efficacy of 150 lm/W or more within a 7-step MacAdam ellipse along the black body curve when operated with a drive current of 350 mA.

54. The light emitter package of claim 50, said package outputting 160 lm or more at an efficacy of 160 lm/W or more when operated with a drive current.

55. The light emitter package of claim 54, said drive current being approximately 350 mA.

56. The light emitter package of claim 50, said submount comprising dimensions of 4 mm square or larger.

57. The light emitter package of claim 56, said package outputting 750 lm or more at an efficacy of 110 lm/W or more when operated with a drive current.

58. The light emitter package of claim 57, said drive current being approximately 2 A.

59. The light emitter package of claim 50, wherein said molded lens comprises silicone.

60. The light emitter package of claim 50, further comprising an intervening layer between said lens and said LED chip.

61. The light emitter package of claim 60, wherein said intervening layer comprises phosphor.

62. A light emitter package, comprising:
a light emitter chip;

a submount comprising a material comprising a thermal conductivity of 30 W/m·K or higher;

a molded lens on said light emitter chip on said submount, such that a portion of said molded lens and said light emitter chip are mounted on the same planar surface of said submount wherein the ratio of the width of said light emitter chip to the width of said lens in a given direction is 0.5 or greater and wherein the ratio of the width of said light emitter chip to the width of said submount in a given direction is 0.35 or more.

63. The light emitter package of claim 62, said submount comprising a thermal conductivity of 50 W/m·K or higher.

64. The light emitter package of claim 62, said submount comprising a thermal conductivity of 100 W/m·K or higher.

65. The light emitter package of claim 62, said submount comprising a thermal conductivity of 120 W/m·K or higher.

66. The light emitter package of claim 62, said submount comprising aluminum nitride.

67. The light emitter package of claim 62, further comprising a conversion material proximate to said light emitter chip, said conversion material comprising phosphor particles comprising a $D_{50}$ particle size greater than 10 microns.

68. The light emitter package of claim 62, further comprising chip alignment features on said submount.

69. The light emitter package of claim 62, further comprising an electrostatic discharge (ESD) protection device.

70. The light emitter package of claim 62, said light emitter chip emitting light comprising an average wavelength of approximately 430-460 nm.

71. The light emitter package of claim 62, said submount comprising dimensions of approximately 3.5 mm square to 5 mm square.

72. The light emitter package of claim 62, said light emitter chip comprising dimensions of approximately 0.7 mm square to 3 mm square.

73. The light emitter package of claim 62, said light emitter chip being approximately 1.75 mm square, said submount being approximately 5 mm square.

74. The light emitter package of claim 62, said light emitter chip being approximately 2 mm square, said submount being approximately 5 mm square.

75. The light emitter package of claim 74, said package exhibiting higher than 150 lumens/watt during operation.

76. The light emitter package of claim 62, said light emitter chip being approximately 3 mm square, said submount being approximately 5 mm square.

77. The light emitter package of claim 76, said package exhibiting higher than 150 lumens/watt during operation.

* * * * *